(12) United States Patent
Choi et al.

(10) Patent No.: US 11,848,351 B2
(45) Date of Patent: Dec. 19, 2023

(54) DISPLAY DEVICE AND DISPLAY DEVICE MANUFACTURING METHOD

(71) Applicant: Samsung Display Co., Ltd., Yongin-Si (KR)

(72) Inventors: Jinwoo Choi, Seoul (KR); Minwoo Kim, Hwaseong-si (KR); Daeho Song, Hwaseong-si (KR); Hyung-Il Jeon, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/989,519

(22) Filed: Nov. 17, 2022

(65) Prior Publication Data

US 2023/0144025 A1    May 11, 2023

Related U.S. Application Data

(62) Division of application No. 16/886,658, filed on May 28, 2020, now Pat. No. 11,538,851.

(30) Foreign Application Priority Data

May 28, 2019    (KR) .................. 10-2019-0062300

(51) Int. Cl.
    *H01L 27/15*    (2006.01)
    *H01L 33/62*    (2010.01)
    (Continued)

(52) U.S. Cl.
    CPC ........ *H01L 27/156* (2013.01); *H01L 33/0093* (2020.05); *H01L 33/40* (2013.01);
    (Continued)

(58) Field of Classification Search
None
See application file for complete search history.

(56) References Cited

U.S. PATENT DOCUMENTS 6,410,942 B1    6/2002    Thibeault et al.
9,159,700 B2   10/2015   Sakariya et al.
(Continued)

FOREIGN PATENT DOCUMENTS

| KR | 10-2017-0024905 A | 3/2017 |
| KR | 10-2018-0089771 A | 8/2018 |
| KR | 10-2018-0127045 A | 11/2018 |

OTHER PUBLICATIONS

"Yole Development 2017 Micro LED Displays", 2017.

*Primary Examiner* — Robert K Carpenter
(74) *Attorney, Agent, or Firm* — Innovation Counsel LLP

(57) ABSTRACT

Provided is a display device including a base layer, a pixel circuit disposed on the base layer, a pixel electrode electrically connected to the pixel circuit, a middle layer disposed on the pixel electrode and including a polymer resin layer and a conductive layer, a plurality of light emitting diodes disposed on the conductive layer and electrically connected to the pixel electrode, and a common electrode configured to cover the plurality of light emitting diodes and electrically connected to the plurality of light emitting diodes. Each of the plurality of light emitting diodes includes a first electrode, a light generating layer, and a second electrode sequentially stacked in a thickness direction of the base layer.

9 Claims, 19 Drawing Sheets

(51) Int. Cl.

| | |
|---|---|
| *H01L 33/40* | (2010.01) |
| *H01L 33/60* | (2010.01) |
| *H01L 33/00* | (2010.01) |
| *H01L 33/44* | (2010.01) |
| *H01L 33/50* | (2010.01) |

(52) U.S. Cl.
CPC ............ *H01L 33/44* (2013.01); *H01L 33/505* (2013.01); *H01L 33/60* (2013.01); *H01L 33/62* (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 10,128,307 B2 | 11/2018 | Chang |
| 11,538,851 B2 * | 12/2022 | Choi ..................... H01L 33/505 |
| 2016/0351764 A1 | 12/2016 | Cha et al. |
| 2017/0309646 A1 | 10/2017 | Son et al. |
| 2019/0013298 A1 | 1/2019 | Lai et al. |
| 2019/0013306 A1 | 1/2019 | Wu et al. |

\* cited by examiner

FIG. 6
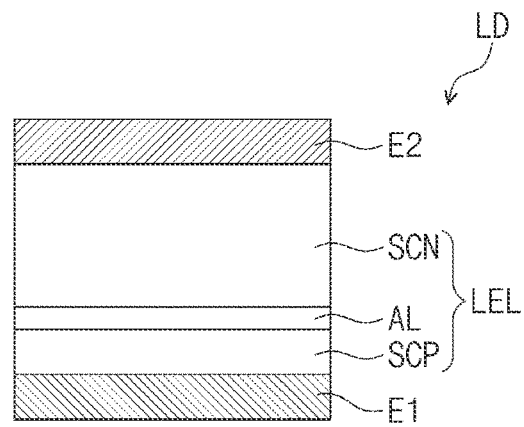
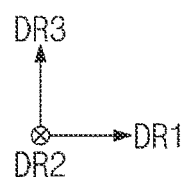
FIG. 7
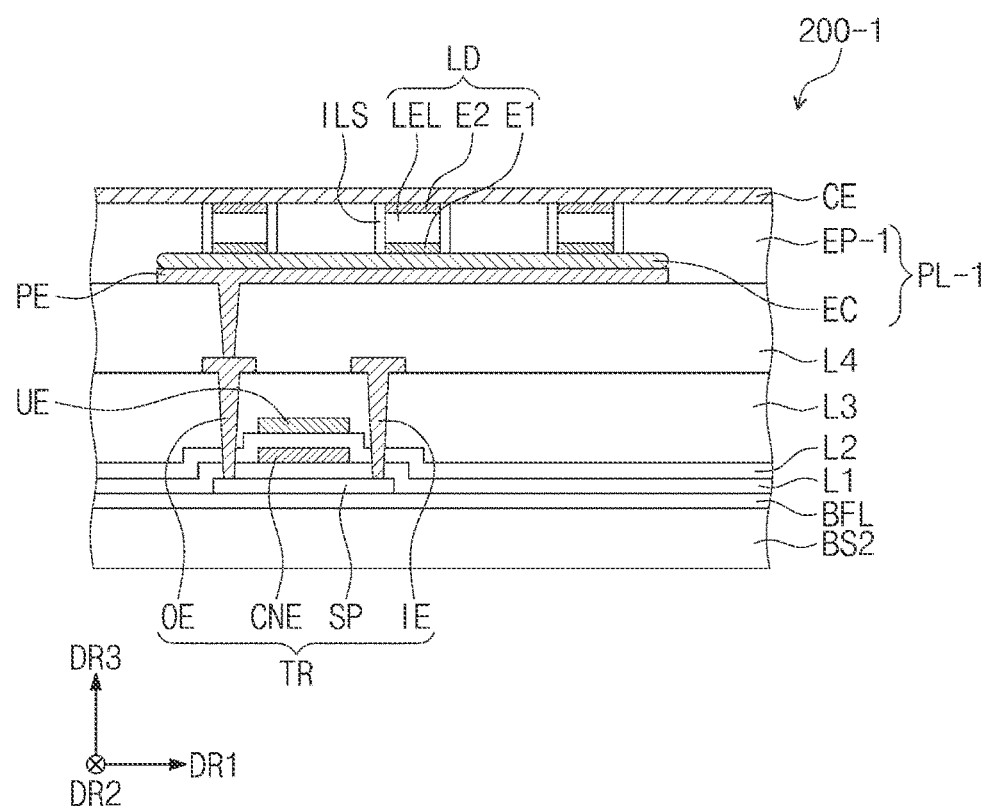

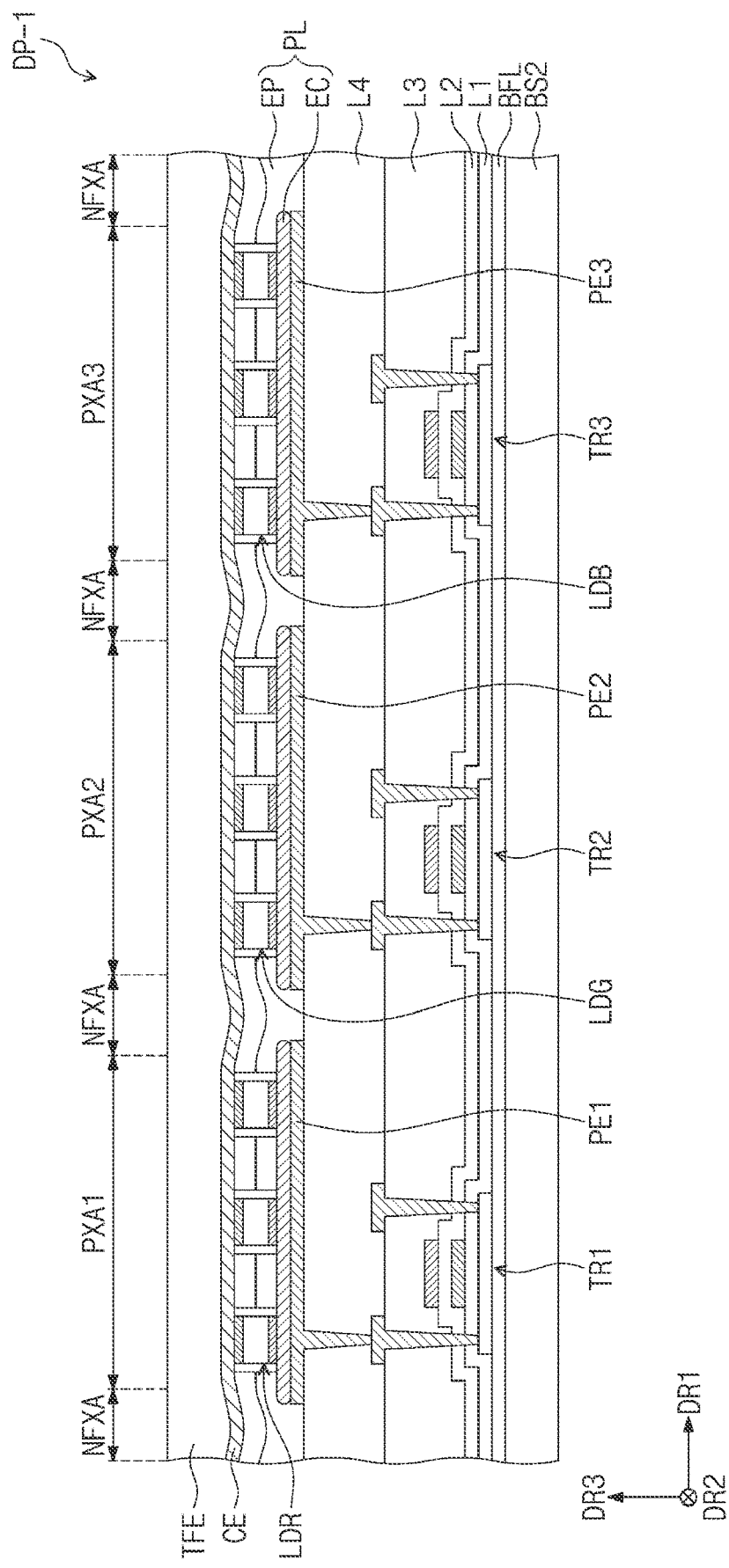

DISPLAY DEVICE AND DISPLAY DEVICE MANUFACTURING METHOD

CROSS-REFERENCE TO RELATED APPLICATION(S)

This application is a divisional application of U.S. patent application Ser. No. 16/886,658 filed on May 28, 2020, which claims priority under 35 USC § 119 to Korean Patent Application No. 10-2019-0062300, filed on May 28, 2019, the entire contents of which are hereby incorporated by reference.

BACKGROUND

The present disclosure herein relates to a manufacturing process simplified display device and a display device manufacturing method.

In the technology field of displays, a display device may include a light emitting diode. The light emitting diode may be electrically connected to an electrode, and may emit light according to a voltage applied to the electrode. The light emitting diode may be formed directly on the electrode, or a light emitting diode formed separately from an electrode may be connected to the electrode. When a light emitting diode is separately formed and connected to an electrode, a process of aligning the light emitting diode on the electrode is required. If the light emitting diode is not properly aligned on the electrode, the light emitting diode may not emit light.

SUMMARY

The present disclosure is to provide a manufacturing process simplified display device and a display device manufacturing method.

An embodiment of the inventive concept provides a display device including: a base layer; a pixel circuit disposed on the base layer; a pixel electrode electrically connected to the pixel circuit; a middle layer disposed on the pixel electrode and including a polymer resin layer and a conductive layer; a plurality of light emitting diodes disposed on the conductive layer and electrically connected to the pixel electrode; and a common electrode configured to cover the plurality of light emitting diodes and electrically connected to the plurality of light emitting diodes, wherein each of the plurality of light emitting diodes includes a first electrode, a light generating layer, and a second electrode sequentially stacked in a thickness direction of the base layer.

In an embodiment, the pixel electrode may include copper, silver, gold or an alloy thereof.

In an embodiment, the conductive layer may be provided as conductive particles condensed between the pixel electrode and the plurality of light emitting diodes.

In an embodiment, the conductive particles may include a tin-bismuth alloy.

In an embodiment, the conductive layer may be provided as the conductive particles dispersed and disposed in the middle layer and condensed to onto the pixel electrode by heat.

In an embodiment, the conductive layer may be disposed between the pixel electrode and the first electrode, and a portion of each of the plurality of light emitting diodes may be surrounded by the polymer resin layer.

In an embodiment, the display device may further include a cover layer covering a side wall of each of the plurality of light emitting diodes.

In an embodiment, the display device may further include an insulating layer disposed on the middle layer and exposing the second electrode of each of the plurality of light emitting diodes, wherein the common electrode may be disposed on the insulating layer.

In an embodiment, the display device may further include a reflection layer surrounding a portion of each of the plurality of light emitting diodes and disposed below the first electrode of each of the plurality of light emitting diodes.

In an embodiment, the plurality of light emitting diodes may be configured to output blue light.

In an embodiment, the display device may further include an optical layer disposed on the plurality of light emitting diodes and including a first wavelength conversion layer, a second wavelength conversion layer, and a light transmission layer, wherein the first wavelength conversion layer may be configured to absorb the blue light and output red light, wherein the second wavelength conversion layer may be configured to absorb the blue light and output green light, wherein the light transmission layer may be configured to transmit the blue light.

In an embodiment, the common electrode may be in direct contact with the second electrode, and the pixel electrode may be electrically connected to the first electrode through the conductive layer.

In an embodiment of the inventive concept, a display device manufacturing method includes: forming a base layer; forming a pixel circuit on the base layer; forming a pixel electrode electrically connected to the pixel circuit on the pixel circuit; forming a middle layer in which a polymer resin and conductive particles are mixed on the pixel electrode; contacting a plurality of light emitting diodes attached to a donor substrate on the middle layer; heating the middle layer to condense the conductive particles on the pixel electrode; separating the donor substrate from the middle layer; and forming a common electrode on valid light emitting diodes transferred onto the pixel electrode among the plurality of light emitting diodes.

In an embodiment, the method may further include: forming an insulating layer on the valid light emitting diodes; and removing a portion of the insulating layer to expose at least a portion of the valid light emitting diodes, wherein the common electrode may be formed on the insulating layer.

In an embodiment, the heating of the middle layer may include heating the middle layer at a temperature between 140 degrees and 180 degrees.

In an embodiment, the pixel electrode may be formed of copper, silver, gold, or an alloy thereof.

In an embodiment, the method may further include forming a reflection layer on each of the plurality of light emitting diodes formed on the donor substrate.

In an embodiment, the forming of the middle layer may include screen-printing a material in which the polymer resin and the conductive particles are mixed.

In an embodiment, the forming of the middle layer may include slit-coating a material in which the polymer resin and the conductive particles are mixed.

In an embodiment, the base layer may include an active area and a peripheral area surrounding the active area, wherein the middle layer may be formed only in an area overlapping the active area on a plane.

In an embodiment, the heating of the middle layer may be performed after the plurality of light emitting diodes are in contact with the middle layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 6 is a cross-sectional view of a light emitting diode according to an embodiment of the inventive concept;

FIG. 7 is a cross-sectional view of a second substrate according to an embodiment of the inventive concept;

FIG. 9 is a cross-sectional view of a display panel according to another embodiment of the inventive concept;

DETAILED DESCRIPTION

Figure 1A:
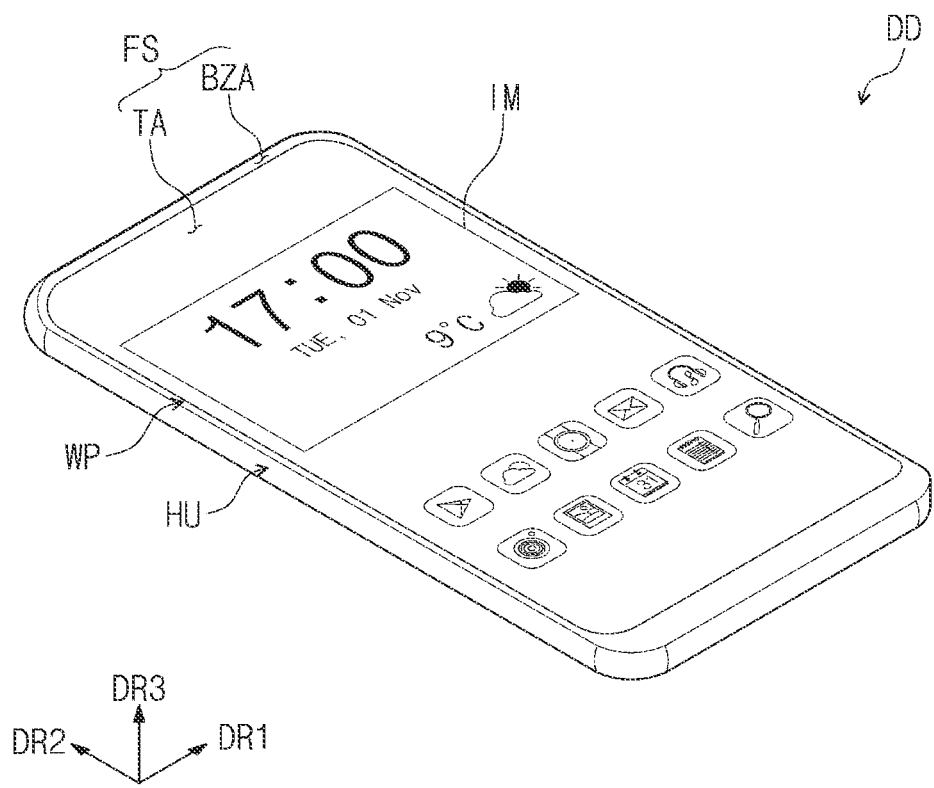
FIG. 1A is an assembled perspective view of a display device according to an embodiment of the inventive concept.

In this specification, when it is mentioned that one component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which this invention belongs. In general, the terms defined in the dictionary should be considered to have the same meaning as the contextual meaning of the related art, and, unless clearly defined herein, should not be understood abnormally or as having an excessively formal meaning.

In various embodiments of the inventive concept, the term "include," "comprise," "including," or "comprising," specifies present of a property, a region, a fixed number, a step, a process, an element and/or a component but does not exclude present of other properties, regions, fixed numbers, steps, processes, elements and/or components.

Hereinafter, an embodiment of the inventive concept will be described with reference to the drawings.

Figure 1B:
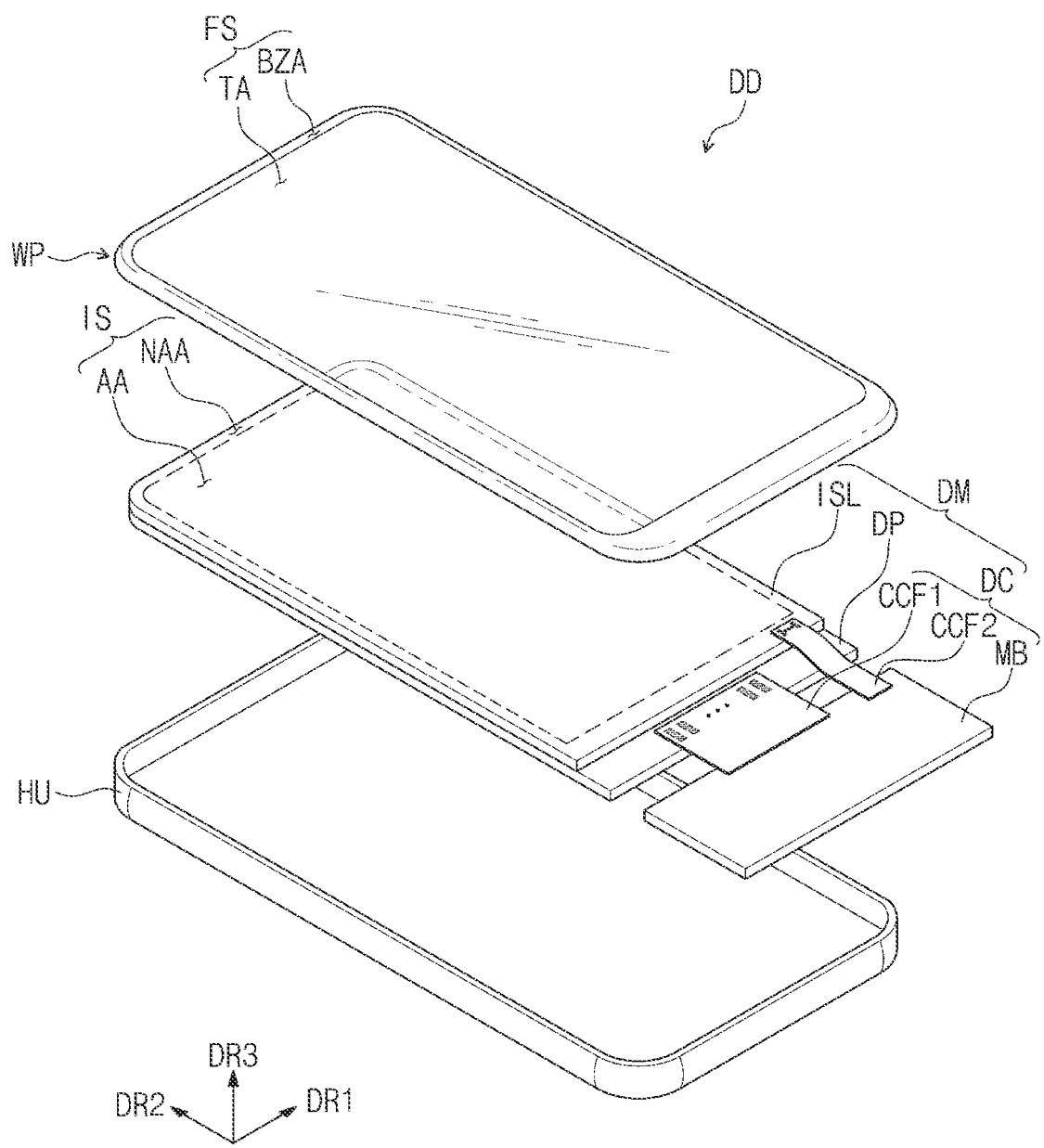
FIG. 1B is an exploded perspective view of a display device according to an embodiment of the inventive concept.

FIG. 1A is an assembled perspective view of a display device according to an embodiment of the inventive concept. FIG. 1B is an exploded perspective view of a display device according to an embodiment of the inventive concept.

Referring to FIGS. 1A and 1B, the display device DD may be a device activated according to an electrical signal. The display device DD may include various embodiments. For example, the display device DD may be used in medium-sized electronic devices such as personal computers, notebook computers, personal digital terminals, car navigation units, game machines, portable electronic devices, and cameras in addition to large-sized electronic devices such as televisions, monitors, or external billboards. In addition, these are simply suggested as embodiments, and the display devices DD so described may be employed in other electronic devices without departing from the scope of the inventive concept. In this embodiment, the display device DD is described, for the purposes of illustration and convenience, as a smart phone.

The display device DD may display the image IM toward the third direction DR3 on the display surface FS parallel to the first direction DR1 and the second direction DR2. The Image IM may include still images as well as dynamic images. In FIG. 1A, a watch window and icons are shown as an example of the image IM. The display surface FS on which the image IM is displayed may correspond to the front surface of the display device DD and may correspond to the front surface of the window WP.

In the present embodiment, the front surface (or upper surface) and the rear surface (or lower surface) of each member are defined with reference to the direction in which the image IM is displayed. The front surface and the rear surface are opposed to each other in the third direction DR3, and the normal direction of each of the front surface and the rear surface may be parallel to the third direction DR3. Moreover, the directions that the first to third directions DR1, DR2, and DR3 indicate may be converted to other directions as a relative concept. In the specification, "when viewed in a plane" may refer to viewing in and/or from the third direction DR3.

The display device DD may include a window WP, a display module DM, and a housing HU. In this embodiment, the window WP and the housing HU are combined to constitute the appearance of the display device DD.

The window WP may include an optically transparent insulating material. For example, the window WP may include glass or plastic. The window WP may have a multi-layer structure or a single-layer structure. For example, the window WP may include a plurality of plastic films bonded together with an adhesive, or may include a glass substrate and a plastic film bonded together with an adhesive.

The front surface of the window WP defines the front surface of the display device DD, as described above. The transmission area TA may be an optically transparent area. For example, the transmission area TA may be an area having a visible light transmittance of about 90% or more.

The bezel area BZA may be an area with a lower light transmittance compared to the transmission area TA. The bezel area BZA defines the shape of the transmission area TA. The bezel area BZA is adjacent to the transmission area TA and may surround the transmission area TA.

The bezel area BZA may have a predetermined color. The bezel area BZA covers the peripheral area NAA of the display module DM so as to prevent the peripheral area NAA from being visually recognized from the outside, e.g. an outside of the display device DD. On the other hand, in an alternate example, the window WP according to an embodiment of the inventive concept may have the bezel area BZA omitted.

The display module DM may display the image IM and sense an external input. The display module DM includes a front surface IS including an active area AA and a peripheral area NAA. The active area AA may be an area activated according to an electrical signal.

In the present embodiment, the active area AA may be an area where the image IM is displayed, and at the same time may be an area where the external input is detected. The transmission area TA may at least overlap the active area AA. For example, the transmission area TA overlaps the front surface or at least part of the active area AA. Accordingly, the user may view the image IM through the transmission area TA or provide an external input. However, this is merely an example, and the area where the image IM is displayed in the active area AA and the area where the external input is detected may be separated from each other so as to not even be partially overlapped, and is not limited to any single embodiment.

The peripheral area NAA may be an area covered by the bezel area BZA. The peripheral area NAA is adjacent to the active area AA. The peripheral area NAA may surround the active area AA. A driving circuit, a driving wiring, and the like for driving the active area AA may be disposed in the peripheral area NAA.

The display module DM includes a display panel DP, an input sensing panel ISL, and a driving circuit DC.

The display panel DP may have a configuration for generating an image IM substantially. The image IM generated by the display panel DP is visually recognized from the outside through the transmission area TA.

The input sensing panel ISL senses an external input applied from the outside. As described above, the input sensing panel ISL may sense the external input provided to the window WP.

The driving circuit DC is electrically connected to the display panel DP and the input sensing panel ISL. The driving circuit DC includes a main circuit board MB, a first circuit board CCF1, and a second circuit board CCF2.

The first circuit board CCF1 is electrically connected to the display panel DP. The first circuit board CCF1 may connect the display panel DP and the main circuit board MB. In this embodiment, the first circuit board CCF1 is shown as a flexible circuit film. However, this is merely an example. The first circuit board CCF1 may not be connected to the main circuit board MB. The first circuit board CCF1 may be a rigid substrate.

The first circuit board CCF1 may be connected to the pads (e.g., display pads) of the display panel DP disposed in the peripheral area NAA. The first circuit board CCF1 provides the display panel DP with an electrical signal for driving the display panel DP. The electrical signal may be generated in the first circuit board CCF1 or generated in the main circuit board MB.

The second circuit board CCF2 is electrically connected to the input sensing panel ISL. The second circuit board CCF2 may connect the input sensing panel ISL and the main circuit board MB. In this embodiment, the second circuit board CCF2 is shown as a flexible circuit film. However, this is merely an example. The second circuit board CCF2 may not be connected to the main circuit board MB. The second circuit board CCF2 may be a rigid substrate.

The second circuit board CCF2 may be connected to the pads (sensing pads) of the input sensing panel ISL disposed in the peripheral area NAA. The second circuit board CCF2 provides the input sensing panel ISL with an electrical signal for driving the input sensing panel ISL. The electrical signal may be generated in the second circuit board CCF2 or generated in the main circuit board MB.

The main circuit board MB may include various driving circuits for driving the display module DM, connectors for power supply, and the like. Each of the first circuit board CCF1 and the second circuit board CCF2 may be connected to the main circuit board MB. According to the inventive concept, the display module DM may be easily controlled through one main circuit board MB. But, this merely an example. In the display module DM according to the embodiment of the inventive concept, the display panel DP and the input sensing panel ISL may be connected to different main circuit boards, and either the first circuit board CCF1 or the second circuit board CCF2 may not be connected to the main circuit board MB. But the inventive concept is not limited to any particular embodiment.

The housing HU is coupled with the window WP. The housing HU is coupled with the window WP to provide a predetermined inner space. The display module DM may be accommodated in the inner space.

The housing HU may include a material having a relatively high stiffness. For example, the housing HU may include a plurality of frames and/or plates including glass, plastic, or metal, or a combination thereof. The housing HU may stably protect the structures of the display device DD accommodated in the inner space from external impacts.

Figure 2:
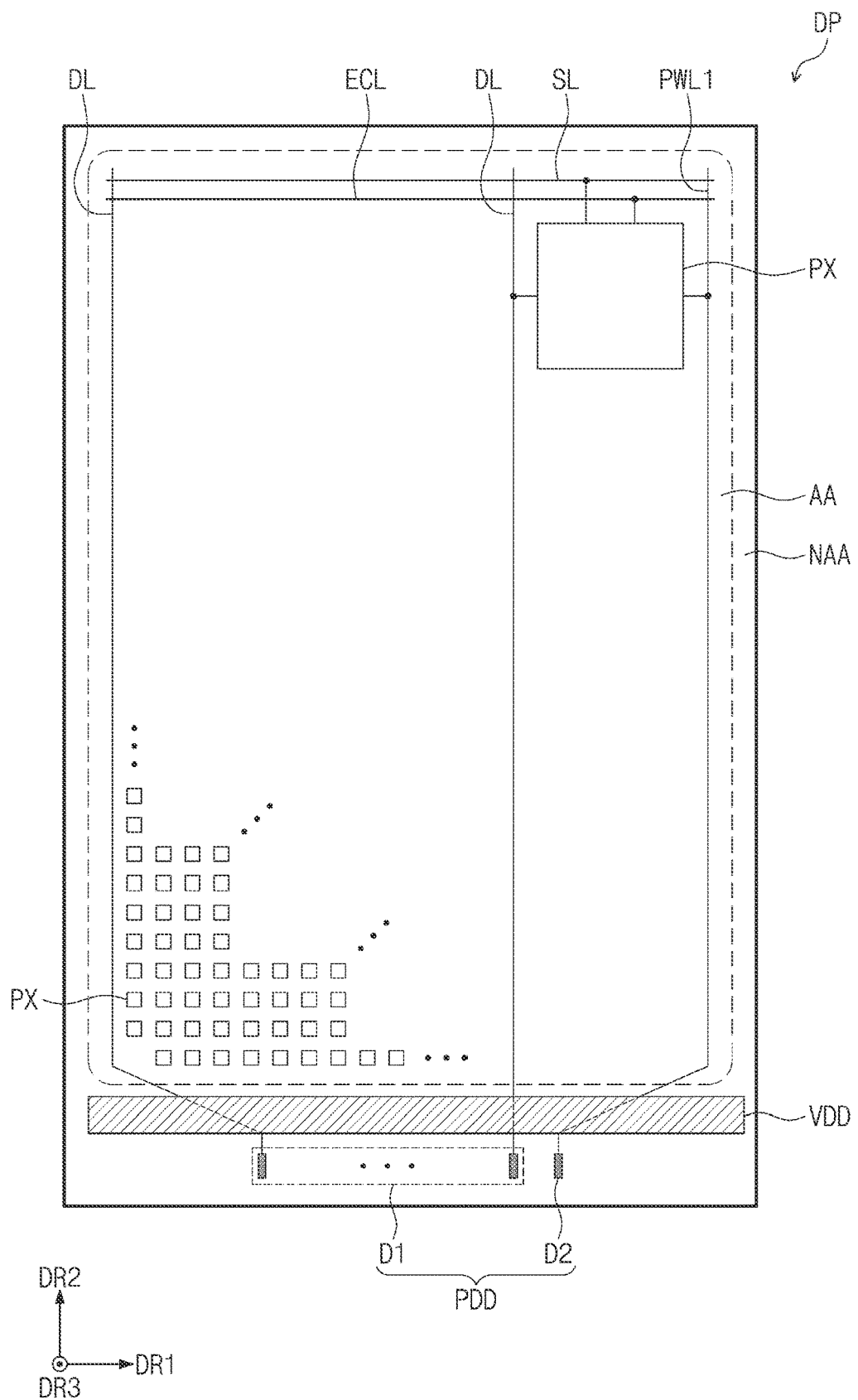
FIG. 2 is a plan view illustrating a display panel according to an embodiment of the inventive concept.
Figure 3:
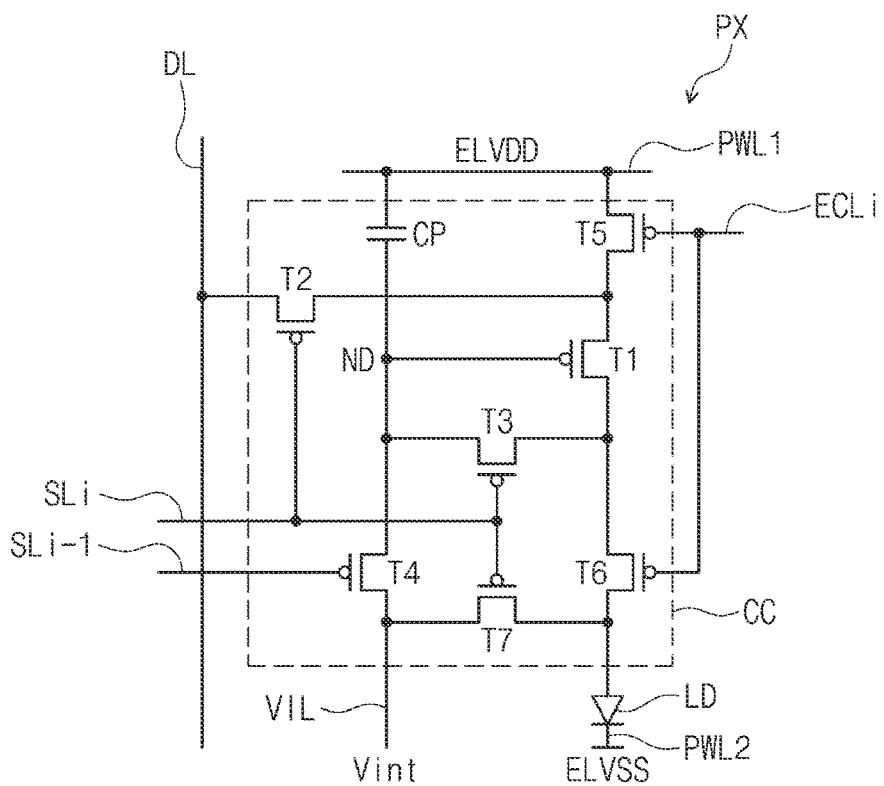
FIG. 3 is an equivalent circuit diagram of a pixel according to an embodiment of the inventive concept.

FIG. 2 is a plan view illustrating a display panel according to an embodiment of the inventive concept. FIG. 3 is an equivalent circuit diagram of a pixel according to an embodiment of the inventive concept.

Referring to FIGS. 2 and 3, the display panel DP includes a plurality of pixels PX, a plurality of signal wirings SL, DL, PWL1, PWL2, and ECL, and a plurality of display pads PDD.

The active area AA of the display panel DP is an area in which an image IM is displayed and the peripheral area NAA may be an area in which a driving circuit and a driving wiring are disposed. In FIG. 2, the active area AA and the peripheral area NAA of the display panel DP are indicated. A plurality of pixels PX may be disposed in the active area AA.

The plurality of signal wirings SL, DL, PWL1, PWL2, and ECL are connected to the pixels PX to transmit electrical signals to the pixels PX. Among the signal wirings included in the display panel DP, the scan wiring SL, the data wiring DL, the power supply wirings PWL1 and PWL2, and the light emission control wiring ECL are illustratively shown. However, this is merely an example, and the signal wirings SL, DL, PWL1, PWL2, and ECL may further include an initialization voltage wiring, and are not limited to any particular embodiment.

In FIG. 3, an equivalent circuit of one pixel PX among a plurality of pixels PX (hereinafter referred to as pixels) is illustratively shown as an example.

Referring to FIG. 3, the pixel PX may be electrically connected to a plurality of signal wirings SL, DL, PWL1, PWL2 and ECL. In FIG. 3, among the signal wirings SL, DL, PWL1, PWL2 and ECL, the scan wirings SLi and SLi−1, the data wiring DL, the first power supply wiring PWL1, the second power supply wiring PWL2, the initialization power supply wiring VIL, and the i-th light emission control wiring ECLi are illustrated by way of example. However the pixel PX according to an embodiment of the inventive concept may be further connected to various signal wirings, and some of the signal wirings shown may be omitted.

The pixel PX may include a light emitting diode LD and a pixel circuit CC. The pixel circuit CC may include a plurality of transistors T1 to T7 and a capacitor CP. The pixel circuit CC may control the amount of current flowing in the light emitting diode LD in correspondence to the data signal.

The light emitting diode LD may emit light at a predetermined luminance corresponding to the amount of current supplied from the pixel circuit CC. For this, the level of the first power supply ELVDD may be set higher than the level of the second power supply ELVSS.

The light emitting diode LD may be a light emitting diode having a size between several nanometers and several hundreds of micrometers. However, the size of the light emitting diode LD is only one example, and the size of the light emitting diode LD is not limited to the above numerical range. In FIG. 3, one light emitting diode LD connected between the pixel circuit CC and the second power supply wiring PWL2 is shown by way of example. However, a plurality of light emitting diodes LD may be provided. The plurality of light emitting diodes LD may be connected in parallel with each other.

Each of the plurality of transistors T1 to T7 may include an input electrode (or a source electrode), an output electrode (or a drain electrode), and a control electrode (or a gate electrode). In the specification, for convenience, either the input electrode or the output electrode may be referred to as a first electrode and the other may be referred to as a second electrode.

The first electrode of the first transistor T1 may be connected to the first power supply wiring PWL1 through the fifth transistor T5. The first power supply wiring PWL1 may be a wiring provided with a first power supply ELVDD. The second electrode of the first transistor T1 is connected to the anode electrode of the light emitting diode LD through the sixth transistor T6. The first transistor T1 may be referred to as a driving transistor in the specification.

The first transistor T1 may control an amount of current flowing in the light emitting diode LD in correspondence to the voltage applied to the control electrode of the first transistor T1.

The second transistor T2 is connected between the data wiring DL and the first electrode of the first transistor T1. Then, the control electrode of the second transistor T2 is connected to the i-th scan wiring SLi. When the i-th scan signal is supplied to the i-th scan wiring SLi, the second transistor T2 is turned on to electrically connect the data wiring DL and the first electrode of the first transistor T1.

The third transistor T3 is connected between the second electrode of the first transistor T1 and the control electrode of the first transistor T1. The control electrode of the third transistor T3 is connected to the i-th scan wiring SLi. When the i-th scan signal is supplied to the i-th scan wiring SLi, the third transistor T3 is turned on to electrically connect the second electrode of the first transistor T1 and the control electrode of the first transistor T1. Therefore, when the third transistor T3 is turned on, the first transistor T1 is connected in a diode form.

The fourth transistor T4 is connected between the node ND and the initialization power supply wiring VIL. The control electrode of the fourth transistor T4 is connected to the (i−1)-th scan wiring SLi−1. The node ND may be a node to which the fourth transistor T4 and the control electrode of the first transistor T1 are connected. When the (i−1)-th scan signal is supplied to the (i−1)-th scan wiring SLi−1, the fourth transistor T4 is turned on to provide the initialization voltage Vint to the node ND.

The fifth transistor T5 is connected between the first power supply wiring PWL1 and the first electrode of the first transistor T1. The sixth transistor T6 is connected between the second electrode of the first transistor T1 and the anode electrode of the light emitting diode LD. The control electrode of the fifth transistor T5 and the control electrode of the sixth transistor T6 are connected to the i-th light emission control wiring ECLi.

The seventh transistor T7 is connected between the initialization power supply wiring VIL and the anode electrode of the light emitting diode LD. Then, the control electrode of the seventh transistor T7 is connected to the i-th scan wiring SLi. When the i-th scan signal is supplied to the i-th scan wiring SLi, the seventh transistor T7 is turned on to provide the initialization voltage Vint to the anode electrode of the light emitting diode LD.

The seventh transistor T7 may improve the black display capability of the pixel PX. Specifically, when the seventh transistor T7 is turned on, the parasitic capacitor (not shown) of the light emitting diode LD is discharged. Then, when the black luminance is realized, the light emitting diode LD does not emit light due to the leakage current from the first transistor T1, and thus the black display capability may be improved.

In addition, although the control electrode of the seventh transistor T7 is illustrated as being connected to the i-th scan wiring SLi in FIG. 3, the inventive concept is not limited thereto. In another embodiment of the inventive concept, the control electrode of the seventh transistor T7 may be connected to the (i−1)-th scan wiring SLi−1 or the (i+1)-th scan wiring (not shown).

In FIG. 3, the PMOS is shown as a reference, but the inventive concept is not limited thereto. In another embodiment of the inventive concept, the pixel circuit CC may be composed of NMOS. In another embodiment of the inventive concept, the pixel circuit CC may be configured by a combination of an NMOS and a PMOS.

The capacitor CP is disposed between the first power supply wiring PWL1 and the node ND. The capacitor CP stores a voltage corresponding to the data signal. When the fifth transistor T5 and the sixth transistor T6 are turned on according to the voltage stored in the capacitor CP, the amount of current flowing through the first transistor T1 may be determined.

The light emitting diode LD may be electrically connected to the sixth transistor T6 and the second power supply wiring PWL2. The light emitting diode LD may receive the second power supply ELVSS via the second power supply wiring PWL2. The light emitting diode LD may include a light emitting layer.

The light emitting diode LD may emit light at a voltage corresponding to the difference between the signal transmitted through the sixth transistor T6 and the second power supply ELVSS received through the second power supply wiring PWL2.

The equivalent circuit of the pixel PX in the inventive concept is not limited to the equivalent circuit shown in FIG. 3. In another embodiment of the inventive concept, the pixel PX may be implemented in various forms for causing the light emitting diode LD to emit light.

Referring again to FIG. 2, the power supply pattern VDD is disposed in the peripheral area NAA. In this embodiment, the power supply pattern VDD is connected to the first power supply wiring PWL1. The display panel DP includes the power supply pattern VDD, thereby providing the same first power supply signal to the plurality of pixels PX.

The display pads PDD may include a first pad D1 and a second pad D2. The plurality of first pads D1 may be connected to the data wirings DL. The second pad D2 may be connected to the power supply pattern VDD and electrically connected to the first power supply wiring PWL1. The display panel DP may provide externally provided electrical signals to the pixels PX through the display pads PDD. Meanwhile, the display pads PDD may further include pads for receiving electrical signals other than the first pads D1 and the second pads D2 and are not limited to any an embodiment.

Figure 4:
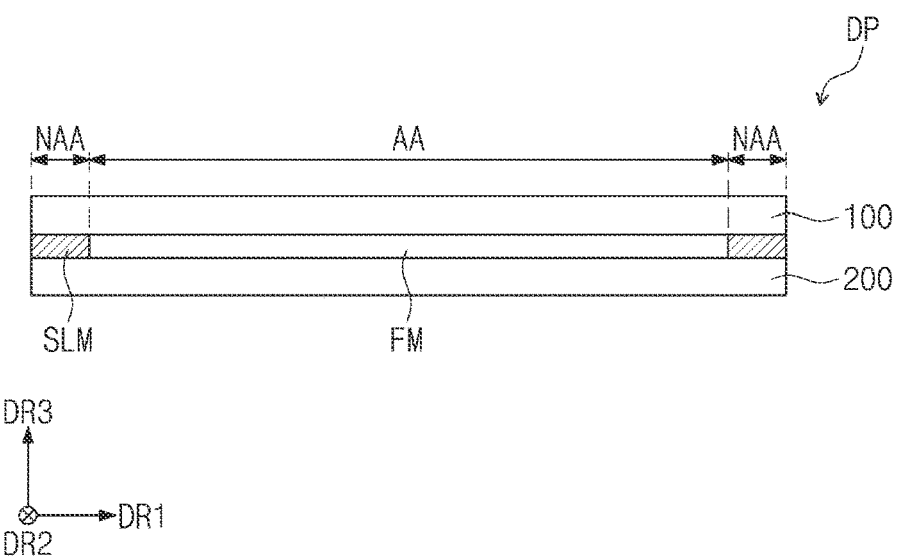
FIG. 4 is a cross-sectional view of a display panel according to an embodiment of the inventive concept.

FIG. 4 is a cross-sectional view of a display panel according to an embodiment of the inventive concept.

Referring to FIG. 4, the display panel DP may include a first substrate 100, a second substrate 200, a panel middle layer FM, and a sealant SLM. The first substrate 100 may be a wavelength conversion substrate, and the second substrate 200 may be a display substrate. For example, the first substrate 100 may include a wavelength conversion material or a material blocking a specific wavelength band. The second substrate 200 may be a substrate that provides light. Details of the first substrate 100 and the second substrate 200 will be described later.

The first substrate 100 and the second substrate 200 may be coupled by the sealant SLM. The sealant SLM may be disposed overlapping with the peripheral area NAA. The sealant SLM may include an organic bonding member, an inorganic bonding member, or a frit. In an embodiment of the inventive concept, the sealant SLM may be omitted.

The panel middle layer FM may be disposed between the first substrate 100 and the second substrate 200. The panel middle layer FM may be a filler. The panel middle layer FM may include a resin and may include, for example, a silicone-based polymer, an epoxy resin or an acrylic resin. In an embodiment of the invention, the panel middle layer FM may be omitted.

Figure 5A:
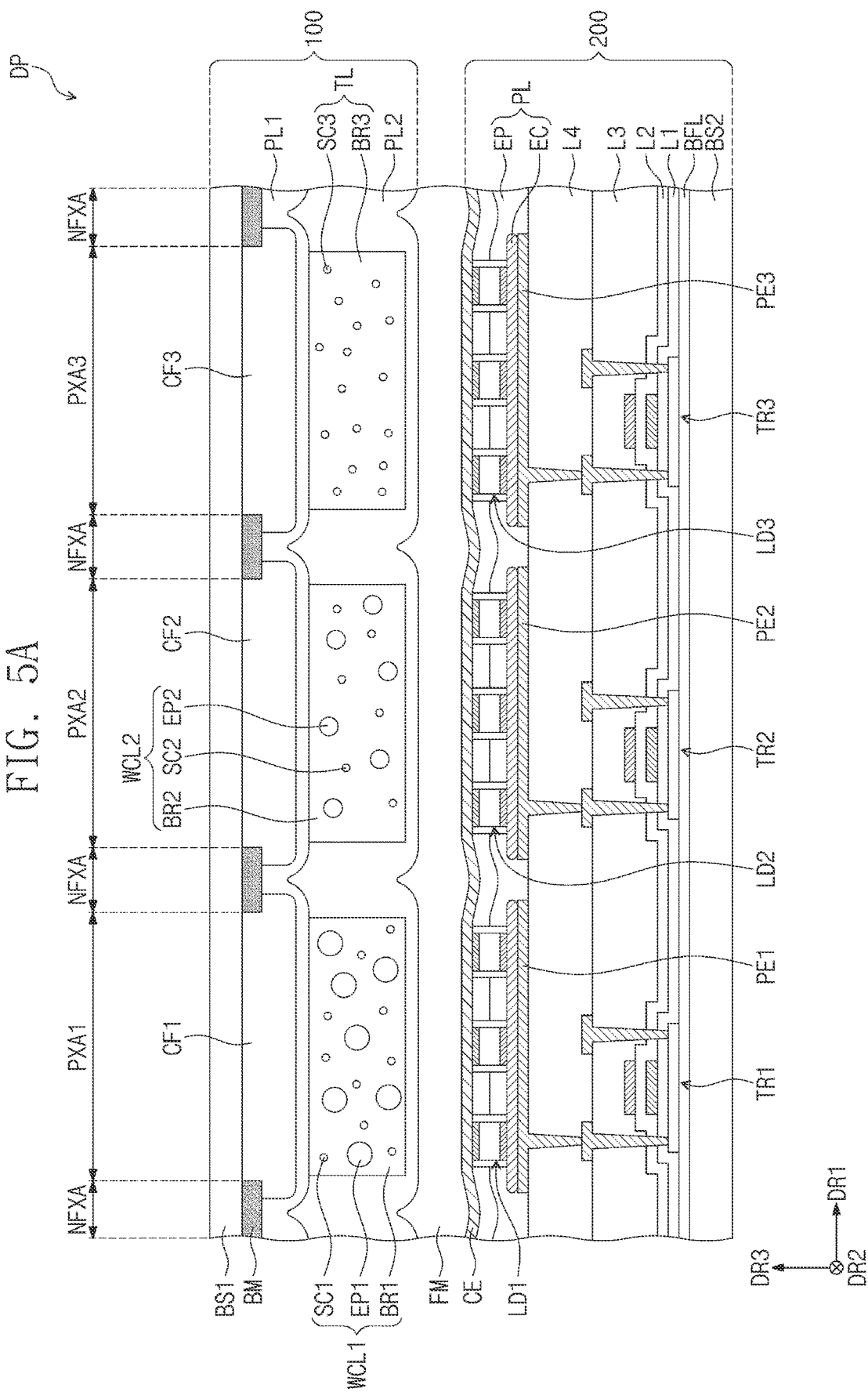
FIG. 5A is a cross-sectional view of a display panel according to an embodiment of the inventive concept.
Figure 5B:
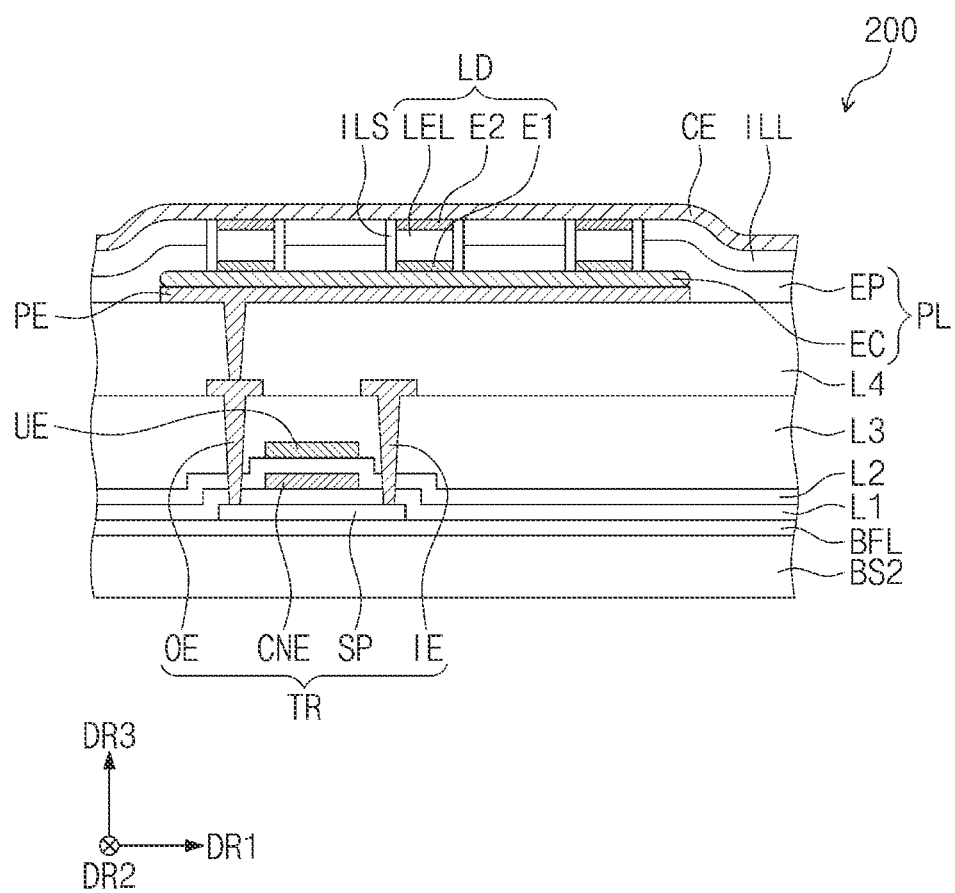
FIG. 5B is a cross-sectional view of a second substrate according to an embodiment of the inventive concept.

FIG. 5A is a cross-sectional view of a display panel according to an embodiment of the inventive concept. FIG. 5B is a cross-sectional view of a second substrate according to an embodiment of the inventive concept.

Referring to FIG. 5A, the first pixel areas PXA1, the second pixel areas PXA2, the third pixel areas PXA3, and the light shielding area NFXA, may be defined on the display panel DP.

The first pixel areas PXA1 provide the first color light, the second pixel areas PXA2 provide the second color light, and the third pixel areas PXA3 provide the third color light. The first color light, the second color light, and the third color light may be light of different colors. For example, one of the first to third color lights may be red light, the other may be green light, and the other may be blue light.

The light shielding area NFXA may be an area defined adjacent to the first pixel areas PXA1, the second pixel areas PXA2, and the third pixel areas PXA3. The light shielding area NFXA may set the boundaries of the first pixel areas PXA1, the second pixel areas PXA2, and the third pixel areas PXA3. The light shielding area NFXA may prevent color mixing between the first pixel areas PXA1, the second pixel areas PXA2, and the third pixel areas PXA3. Also, the light shielding area NFXA may block the light so that the light is not provided to the user.

The first substrate 100 may include a base layer BS1, first to third color filter layers CH, CF2 and CF3, a light shielding layer BM, optical layers WCL1, WCL2 and TL, and first and second protective layers PL1 and PL2.

The base layer BS1 may be a silicon substrate, a plastic substrate, a glass substrate, an insulating film, or a laminated structure including a plurality of insulating layers.

The light shielding layer BM may be disposed on one surface of the base layer BS1. The light shielding layer BM may overlap the light shielding area NFXA on a plane. The light shielding layer BM may not overlap with the first pixel areas PXA1, the second pixel areas PXA2, and the third pixel areas PXA3. That is, a plurality of opening parts may be defined in the light shielding layer BM, and the plurality of opening parts may overlap the first pixel areas PXA1, the second pixel areas PXA2, and the third pixel areas PXA3 on a plane.

A first color filter layer CF1 may be disposed on one surface of the base layer BS1. For example, the first color filter layer CF1 may be disposed under the base layer BS1. The first color filter layer CF1 may overlap with the first pixel areas PXA1 on a plane.

A second color filter layer CF2 may be disposed on one surface of the base layer BS1. For example, the second color filter layer CF2 may be disposed under the base layer BS1. The second color filter layer CF2 may overlap the second pixel areas PXA2 on a plane.

A third color filter layer CF3 may be disposed on one surface of the base layer BS1. For example, the third color filter layer CF3 may be disposed under the base layer BS1. The third color filter layer CF3 may overlap the third pixel areas PXA3 on a plane.

The first color filter layer CF1 may be a red color filter layer, the second color filter layer CF2 may be a green color filter layer, and the third color filter layer CF3 may be a blue color filter layer.

The arrangement relationship of the first color filter layer CF1, the second color filter layer CF2, the third color filter layer CF3, and the light shielding layer BM is not limited to the embodiment shown in FIG. 5A. For example, in an embodiment of the inventive concept, at least one of the first color filter layer CF1, the second color filter layer CF2, the third color filter layer CF3, and the light shielding layer BM may be omitted. Also, in an embodiment of the inventive concept, the third color filter layer CF3 may be disposed between the light shielding layer BM and the one surface of the base layer BS1. In this case, the third color filter layer CF3 may overlap the light shielding area NFXA and the third pixel areas PXA3, and may not overlap the first pixel areas PXA1 and the second pixel areas PXA2.

The first protective layer PL1 may cover the first to third color filter layers CF1, CF2, and CF3 and the light shielding layer BM. The first protective layer PL1 may include one of silicon oxide, silicon nitride, or silicon oxynitride. In another embodiment of the inventive concept, the first protective layer PL1 may be omitted.

The optical layers WCL1, WCL2, and TL may be disposed under the first protective layer PL1. The optical layers WCL1, WCL2, and TL may include a first wavelength conversion layer WCL1, a second wavelength conversion layer WCL2, and a light transmission layer TL.

The first wavelength conversion layer WCL1 is arranged in the first pixel area PXA1 and the second wavelength conversion layer WCL2 is arranged in the second pixel area PXA2 and the light transmission layer TL is arranged in the third pixel area PXA3. The first wavelength conversion layer WCL1 may be disposed below the first color filter layer CF1 and the second wavelength conversion layer WCL2 may be disposed below the second color filter layer CF2 and the light transmission layer TL may be disposed under the third color filter layer CF3.

The first wavelength conversion layer WCL1 may include a first base resin BR1, first scattering particles SC1, and a first light emitting body EP1 and the second wavelength conversion layer WCL2 may include a second base resin BR2, second scattering particles SC2, and a second light emitting body EP2 and the light transmission layer TL may include a third base resin BR3 and third scattering particles SC3.

The first to third base resins BR1, BR2 and BR3 are mediums in which light emitting bodies or scattering particles are dispersed, and may be composed of various resin compositions generally referred to as binders. However, the inventive concept is not limited thereto, and a medium capable of dispersing light emitting bodies or scattering particles in this specification may be referred to as a base resin regardless of its name, additional other functions, constituent materials, and the like. The base resin may be a polymer resin. For example, the base resin may be an acrylic resin, a urethane resin, a silicone resin, an epoxy resin, or the like. The base resin may be a transparent resin.

The first to third scattering particles SC1, SC2, and SC3 may be $TiO_2$ or silica-based nanoparticles. The first to third scattering particles SC1, SC2, and SC3 may scatter light. Since the light transmission layer TL does not include a light emitting body, the amount of the third scattering particles SC3 included in the light transmission layer TL may be equal to or greater than the amount of each of the first scattering particles SC1 included in the first wavelength conversion layer WCL1 and the second scattering particles SC2 included in the second wavelength conversion layer WCL2. In another embodiment of the inventive concept, the first and second scattering particles SC1 and SC2 may be omitted.

Each of the first light emitting body EP1 and the second light emitting body EP2 may be particles that convert the wavelength of light. For example, each of the first light emitting body EP1 and the second light emitting body EP2 may be a quantum dot, a quantum rod, or a phosphor.

The quantum dot is a material with a crystal structure of a few nanometers in size and consists of hundreds to thousands of atoms, and shows a quantum confinement effect in which an energy band gap is increased due to a small size. When a light of a wavelength with energy higher than a band gap is incident on the quantum dots, the quantum dots absorbs the light and becomes excited state and drops to the ground state while emitting a light of a specific wavelength. The light of the emitted wavelength has a value corresponding to the band gap. The quantum dots may adjust the light emission characteristics of the quantum confinement effect when adjusting its size and composition.

The quantum dot may have a full width of half maximum (FWHM) of the emission wavelength spectrum of about 45 nm or less, preferably about 40 nm or less, more preferably about 30 nm or less, and in this range, color purity and color reproducibility may be improved. Further, since light emitted through the quantum dots is emitted in all directions, a wide viewing angle may be improved.

In addition, the shape of the quantum dots is not particularly limited as long as it is a form commonly used in the art, and more specifically, it may be in the form of spherical, pyramidal, multi-arm or cubic nanoparticles, nanotubes, nanowires, nanofibers, nano platelike particles, and the like.

Quantum dots may control the color of emitted light according to the particle size, and thus the quantum dots may have various luminescent colors such as blue, red, and green. According to the embodiment of the inventive concept, when the first light emitting body EP1 and the second light emitting body EP2 are quantum dots, the particle sizes of the first light emitting body EP1 and the particle size of the second light emitting body EP2 may be different from each other. For example, the particle size of the first light emitting body EP1 may be larger than that of the second light emitting body EP2. In this case, the first light emitting body EP1 may emit a longer wavelength light than the second light emitting body EP2.

The first wavelength conversion layer WCL1 may convert blue light into red light and provide it to a first color filter layer CF1, and the second wavelength conversion layer WCL2 may convert blue light into green light and provide it to the second color filter layer CF2, and the light transmission layer TL may scatter blue light and provide it to the third color filter layer CF3.

The first color filter layer CF1 may transmit light in a wavelength range of red light and absorb other light. The second color filter layer CF2 may transmit light in a wavelength range of green light and absorb other light. The third color filter layer CF3 may transmit light in a wavelength range of blue light and absorb other light.

The second protective layer PL2 may cover the first wavelength conversion layer WCL1, the second wavelength conversion layer WCL2, and the light transmission layer TL. The second protective layer PL2 may include one of silicon oxide, silicon nitride, or silicon oxynitride.

The second substrate 200 will be described with reference to FIGS. 5A and 5B.

The base layer BS2 of the second substrate 200 may be a silicon substrate, a plastic substrate, a glass substrate, an insulating film, or a laminated structure including a plurality of insulating layers.

The buffer layer BFL may be disposed on the base layer BS2. The buffer layer BFL may include an inorganic material. The buffer layer BFL may provide lower surface energy than the base layer BS2 so that the pixels PX are stably formed on the base layer BS2.

Transistors TR1, TR2 and TR3 may be arranged on the buffer layer BFL. Each of the transistors TR1, TR2, and TR3 shown in FIG. 5A may correspond to the sixth transistor T6

(see FIG. 3) shown in FIG. 3. The transistor TR shown in FIG. 5B may correspond to each of the transistors TR1, TR2, and TR3 shown in FIG. 5A. Hereinafter, the transistor TR will be described as an example.

The transistor TR may include a semiconductor layer SP, a control electrode CNE, a first electrode IE, and a second electrode OE.

The semiconductor layer SP may be disposed on the buffer layer BFL. The semiconductor layer SP may include polysilicon or amorphous silicon. In addition, the semiconductor layer SP may include a metal oxide semiconductor. The semiconductor layer SP may include a channel area serving as a passage through which electrons or holes may travel, and a first ion-doped area and a second ion-doped area disposed between the channel areas.

The first insulating layer L1 is disposed on the buffer layer BFL and may cover the semiconductor layer SP. The first insulating layer L1 may include an inorganic material. The inorganic material may include at least one of a silicon nitride, a silicon oxynitride, a silicon oxide, a titanium oxide, or an aluminum oxide.

A control electrode CNE may be disposed on the first insulating layer L1. A control electrode CNE may serve as one electrode of the capacitor CP described with reference to FIG. 3. The second insulating layer L2 is disposed on the first insulating layer L1 and may cover the control electrode CNE. The second insulating layer L2 may include an inorganic material.

An upper electrode UE may be disposed on the second insulating layer L2. The upper electrode UE may be another electrode of the capacitor CP described with reference to FIG. 3.

The third insulating layer L3 covers the upper electrode UE and may be disposed on the second insulating layer L2. The first electrode IE and the second electrode OE of the transistor TR may be disposed on the third insulating layer L3. The first electrode IE and the second electrode OE of the transistor TR may be electrically connected to the semiconductor layer SP through the through holes penetrating the first insulating layer L1, the second insulating layer L2 and the third insulating layer L3.

The fourth insulating layer L4 is disposed on the third insulating layer L3 and may cover the first electrode IE and the second electrode OE of the transistor TR. The fourth insulating layer L4 may be composed of a single layer or a plurality of layers. For example, the single layer may include an organic layer. The plurality of layers may be provided by stacking an organic layer and an inorganic layer. The fourth insulating layer L4 may be a planarization layer providing a flat surface on the upper part thereof.

The pixel electrode PE may be disposed on the fourth insulating layer L4. Referring to FIG. 5A, a first pixel electrode PE1 electrically connected to the first transistor TR1, a second pixel electrode PE2 electrically connected to the second transistor TR2, and a third pixel electrode PE3 electrically connected to the third transistor TR3 are shown. The transistor TR shown in FIG. 5B may correspond to each of the transistors TR1, TR2, and TR3 shown in FIG. 5A. Hereinafter, the pixel electrode PE will be described as an example.

The pixel electrode PE may be electrically connected to the second electrode OE of the transistor TR. In an embodiment of the inventive concept, the pixel electrode PE may include copper, silver, gold, or an alloy thereof. In this case, the conductive particles may condense on the pixel electrode PE. The conductive particles may be particles mixed in the middle layer PL.

A middle layer PL may be disposed on the pixel electrode PE. The middle layer PL may include a polymer resin layer EP and conductive particles. The conductive particles may condense on the pixel electrode PE to form the conductive layer EC.

A plurality of light emitting diodes LD may be disposed on the conductive layer EC. The plurality of light emitting diodes LD may be electrically connected to the pixel electrodes PE. Although it is shown in FIG. 5B exemplarily that three light emitting diodes LD are arranged on one pixel electrode PE, the inventive concept is not limited thereto. For example, in another embodiment of the inventive concept, two or more light emitting diodes LD may be disposed on one pixel electrode PE. According to an embodiment of the inventive concept, a plurality of light emitting diodes LD are disposed on one pixel electrode PE. Therefore, even if one of the plurality of light emitting diodes LD does not emit light, another light emitting diode LD may emit light. As a result, the probability of occurrence of defective pixels that do not provide light may be reduced.

Also, in FIGS. 5A and 5B, a plurality of light emitting diodes LD are shown as being arranged on the conductive layer EC. However, the inventive concept is not limited thereto. In an embodiment of the inventive concept, a portion of each of the plurality of light emitting diodes LD may be surrounded by a conductive layer EC. For example, at least a portion of each of the plurality of light emitting diodes LD in the thickness direction may be recessed in the conductive layer EC.

Also, in an embodiment of the inventive concept, the conductive layer EC and the polymer resin layer EP may be distinguished by the concentration of the conductive particles. For example, the concentration of the conductive particles included in the conductive layer EC may be higher than the concentration of the conductive particles included in the polymer resin layer EP. Therefore, in an embodiment of the inventive concept, the boundary between the conductive layer EC and the polymer resin layer EP may not be clearly distinguished as shown in the drawing.

Referring again to FIG. 5A, the first light emitting diodes LD1 may be disposed on the first pixel electrode PE1, and the second light emitting diodes LD2 may be disposed on the second pixel electrode PE2, and the third light emitting diodes LD3 may be disposed on the third pixel electrode PE3. The first to third light emitting diodes LD1, LD2 and LD3 may output blue light. In an embodiment of the inventive concept, when the first to third light emitting diodes LD1, LD2, and LD3 output blue light, the third color filter layer CF3 may be omitted.

The light emitting diodes LD shown in FIG. 5B may correspond to the first to third light emitting diodes LD1, LD2, and LD3 shown in FIG. 5A. Hereinafter, the light emitting diodes LD will be described as an example.

Each of the plurality of light emitting diodes LD may include a first electrode E1, a light generating layer LEL, and a second electrode E2. In an embodiment of the inventive concept, the first electrode E1, the light generating layer LEL, and the second electrode E2 may be stacked in the thickness direction of the base layer BS2. The thickness direction of the base layer BS2 may be the third direction DR3. That is, each of the plurality of light emitting diodes LD may be a vertical type light emitting diode.

In the case of a vertical type light emitting diode, the process of removing a portion of the stacked structure may be omitted. Therefore, the damage caused by the additional etching process may be minimized. Further, the current of the vertical type light emitting diode may be injected vertically. Therefore, the current concentration phenomenon which causes current leakage, electrostatic discharge phenomenon and the like may be prevented. Further, the first electrode E1 of the light emitting diodes LD may be provided as a reflective electrode, and among the generated light, the light directed toward the first electrode E1 of the light emitting diodes LD may be reflected and then emitted upward again. Therefore, the luminous efficiency of the vertical type light emitting diode may be improved.

A cover layer ILS may be disposed on the side wall of each of the light emitting diodes LD. The cover layer ILS may include an insulating material. For example, the cover layer ILS may include any one of silicon oxide, silicon nitride, or silicon oxynitride. The cover layer ILS protects each of the light emitting diodes LD and may prevent current from leaking from the side walls of the light emitting diodes LD.

The first electrode E1 of the light emitting diodes LD may be electrically connected to the pixel electrode PE through the conductive layer EC. A portion of each of the light emitting diodes LD may be surrounded by a polymer resin layer EP.

The insulating layer ILL may be disposed on the middle layer PL. The insulating layer ILL may expose the second electrode E2 of each of the light emitting diodes LD. The insulating layer ILL may be a photoresist layer.

The common electrode CE may be disposed on the insulating layer ILL. The common electrode CE may be electrically connected to the light emitting diodes LD. For example, the common electrode CE may directly contact the second electrode E2 of each of the light emitting diodes LD. The common electrode CE may be a transparent electrode. For example, the common electrode CE may include IZO or ITO.

Moreover, the structure in which the first to fourth insulating layers L1, L2, L3 and L4 are arranged and the structure in which the pixel electrode PE is directly connected to the second electrode OE of the transistor TR are described as an example with reference to FIG. 5B, but they are not limited thereto. The number of the insulating layers may be four or more, and a connection electrode may be further disposed between the pixel electrode PE and the second electrode OE of the transistor TR.

FIG. 6 is a cross-sectional view of a light emitting diode according to an embodiment of the inventive concept.

Referring to FIG. 6, a cross-sectional view of one light emitting diode LD is shown. The light emitting diode LD may include a first electrode E1, a light generating layer LEL, and a second electrode E2. The light generating layer LEL may include a p-type semiconductor layer SCP, an active layer AL, and an n-type semiconductor layer SCN. The p-type semiconductor layer SCP, the active layer AL, and the n-type semiconductor layer SCN may be sequentially stacked on the first electrode E1 of the light emitting diodes LD. The p-type semiconductor layer SCP may be connected to the first electrode E1 of the light emitting diodes LD and the n-type semiconductor layer SCN may be connected to the second electrode E2 of the light emitting diodes LD. The active layer AL may be disposed between the n-type semiconductor layer SCN and the p-type semiconductor layer SCP.

The n-type semiconductor layer SCN may be provided by doping the semiconductor layer with an n-type dopant, and the p-type semiconductor layer SCP may be provided by doping the semiconductor layer with a p-type dopant. The semiconductor layer may include a semiconductor material, and the semiconductor material may be, for example, GaN, AlN, AlGaN, InGaN, InN, InAlGaN, or AlInN, but is not limited thereto. The n-type dopant may be silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), barium (Ba), or a combination thereof, but is not limited thereto.

The active layer AL may be formed of at least one of a single quantum well structure, a multiple quantum well structure, a quantum wire structure, or a quantum dot structure. The active layer AL may be an area where electrons injected through the n-type semiconductor layer SCN and holes injected through the p-type semiconductor layer SCP are recombined. The active layer AL is a layer that emits light with energy determined by the material-specific energy band. The position of the active layer AL may be varied depending on the type of diode.

FIG. 7 is a cross-sectional view of a second substrate according to an embodiment of the inventive concept.

Referring to FIG. 7, the second substrate 200-1 may not include the insulating layer ILL (see FIG. 5B) when compared with the second substrate 200 described above with reference to FIG. 5B.

A middle layer PL-1 may be disposed on the pixel electrode PE. The middle layer PL-1 may include a polymer resin layer EP-1 and conductive particles. The conductive particles may condense on the pixel electrode PE to form the conductive layer EC. That is, the middle layer PL-1 may include the conductive layer EC and the polymer resin layer EP-1.

The conductive layer EC may electrically connect the plurality of light emitting diodes LD and the pixel electrodes PE. The polymer resin layer EP-1 may cover the conductive layer EC.

The common electrode CE may be disposed on the polymer resin layer EP-1. The common electrode CE is spaced apart from the conductive layer EC by a polymer resin layer EP-1 and may be electrically connected to the light emitting diodes LD.

Figure 8:
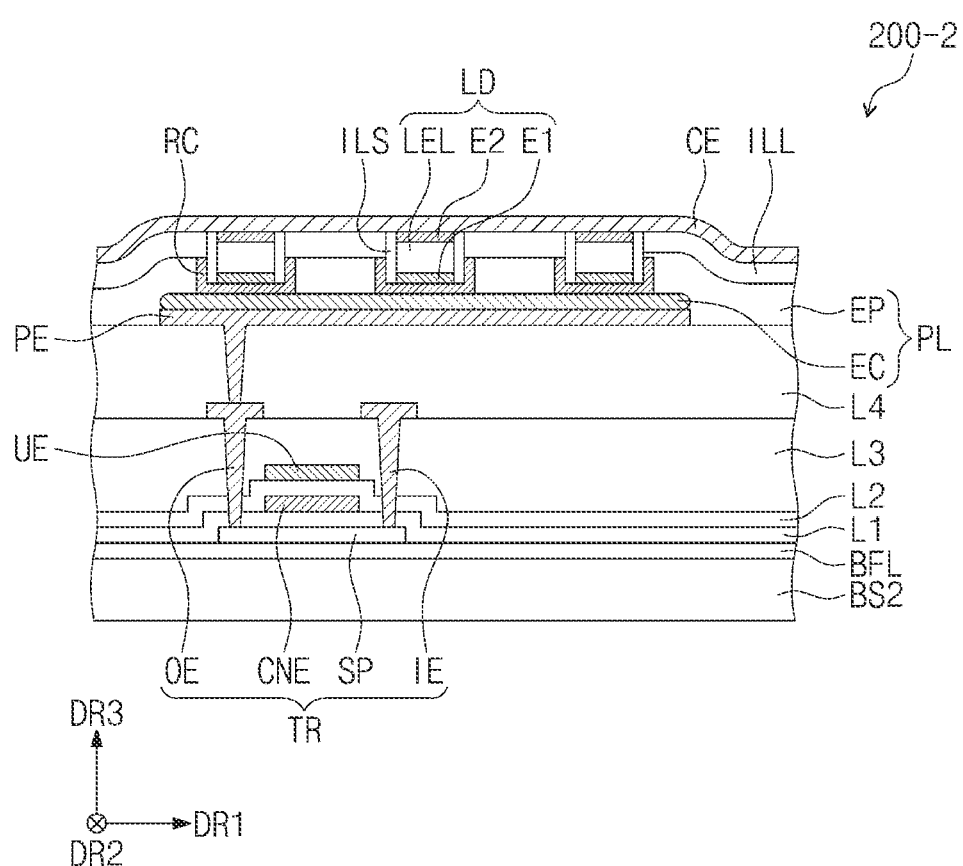
FIG. 8 is a cross-sectional view of a second substrate according to an embodiment of the inventive concept.

FIG. 8 is a cross-sectional view of a second substrate according to an embodiment of the inventive concept.

Referring to FIG. 8, the second substrate 200-2 may further include reflection layers RC as compared with the second substrate 200 described above with reference to FIG. 5B.

The reflection layers RC may surround at least a portion of the light emitting diodes LD, respectively.

The reflection layer RC may improve light emission efficiency by reflecting the light provided by the light emitting diode LD. The reflection layer RC may include a metal or a metal alloy.

The reflection layer RC may have a cup shape, and at least a portion of the light emitting diode LD may be surrounded by a cup-shaped reflection layer RC. For example, a portion of the reflection layer RC may be disposed between the light emitting diode LD and the conductive layer EC. In addition, another portion of the reflection layer RC may surround a portion of the side wall of the light emitting diode LD. A cover layer ILS may be disposed between another portion of the reflection layer RC and the side wall of the light emitting diode LD.

FIG. 9 is a cross-sectional view of a display panel according to another embodiment of the inventive concept.

Referring to FIG. 9, the first pixel areas PXA1, the second pixel areas PXA2, the third pixel areas PXA3, and the light shielding area NFXA are defined in the display panel DP-1.

The first pixel areas PXA1 provide the first color light, and the second pixel areas PXA2 provide the second color light, and the third pixel areas PXA3 provide the third color light. The first color light, the second color light, and the third color light may be light of different colors. For example, one of the first to third color lights may be red light, the other may be green light, and the other may be blue light.

The light emitting diodes LDR disposed in the first pixel areas PXA1 may provide the first color light. The light emitting diodes LDG disposed in the second pixel areas PXA2 may provide the second color light. And the light emitting diodes LDB disposed in the third pixel areas PXA3 may provide the third color light.

Unlike the embodiment of FIG. 5A, the light emitting diodes LDR, LDG, and LDB shown in FIG. 9 may provide light of different colors. Therefore, the first substrate 100 (see FIG. 5A) may be omitted.

The display panel DP-1 may include a thin film sealing layer TFE disposed on the common electrode CE. The thin film sealing layer TFE may include alternately stacked inorganic and organic layers.

FIGS. 10A to 10G are views showing a part of a manufacturing process of a display panel according to an embodiment of the inventive concept.

Figure 10A:
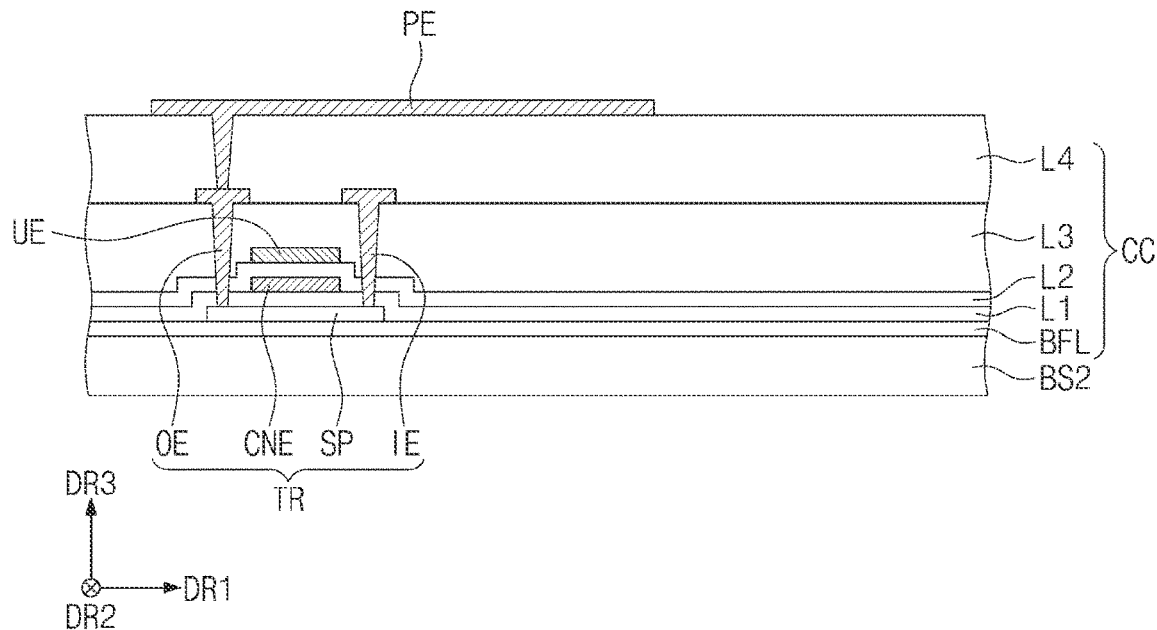
FIGS. 10A, 10B, 10C, 10D, 10E, 10F, and 10G are views showing a part of a manufacturing process of a display panel according to an embodiment of the inventive concept.

Referring to FIG. 10A, a base layer BS2 is formed. A pixel circuit CC is formed on the base layer BS2. A pixel electrode PE is formed on the pixel circuit CC. The pixel electrode PE may be electrically connected to the pixel circuit CC. For example, the pixel electrode PE may be electrically connected to the second electrode OE of the transistor TR.

The pixel electrode PE may be formed using gold, silver, or copper. However, the material constituting the pixel electrode PE is not limited to the above example. For example, the pixel electrode PE may include a material on which the conductive particles included in the middle layer PL-P to be described later may condense.

Figure 10B:
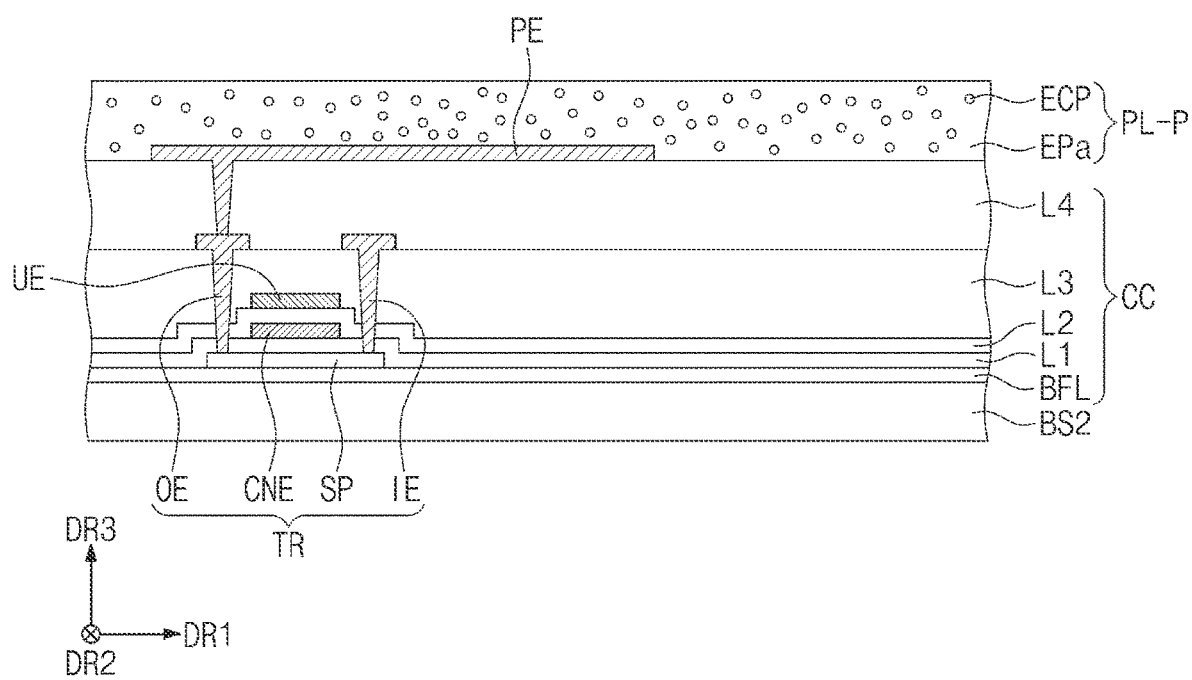

Referring to FIG. 10B, a middle layer PL-P is formed on the pixel electrode PE. The middle layer PL-P may include polymer resin EPa and conductive particles ECP. Forming the middle layer PL-P may include screen-printing a mixed material of the polymer resin EPa and the conductive particles ECP or slit-coating a mixed material of the polymer resin EPa and the conductive particles ECP. Materials mixed with the polymer resin EPa and the conductive particles ECP may be a low temperature melting solder paste.

Figure 10C:
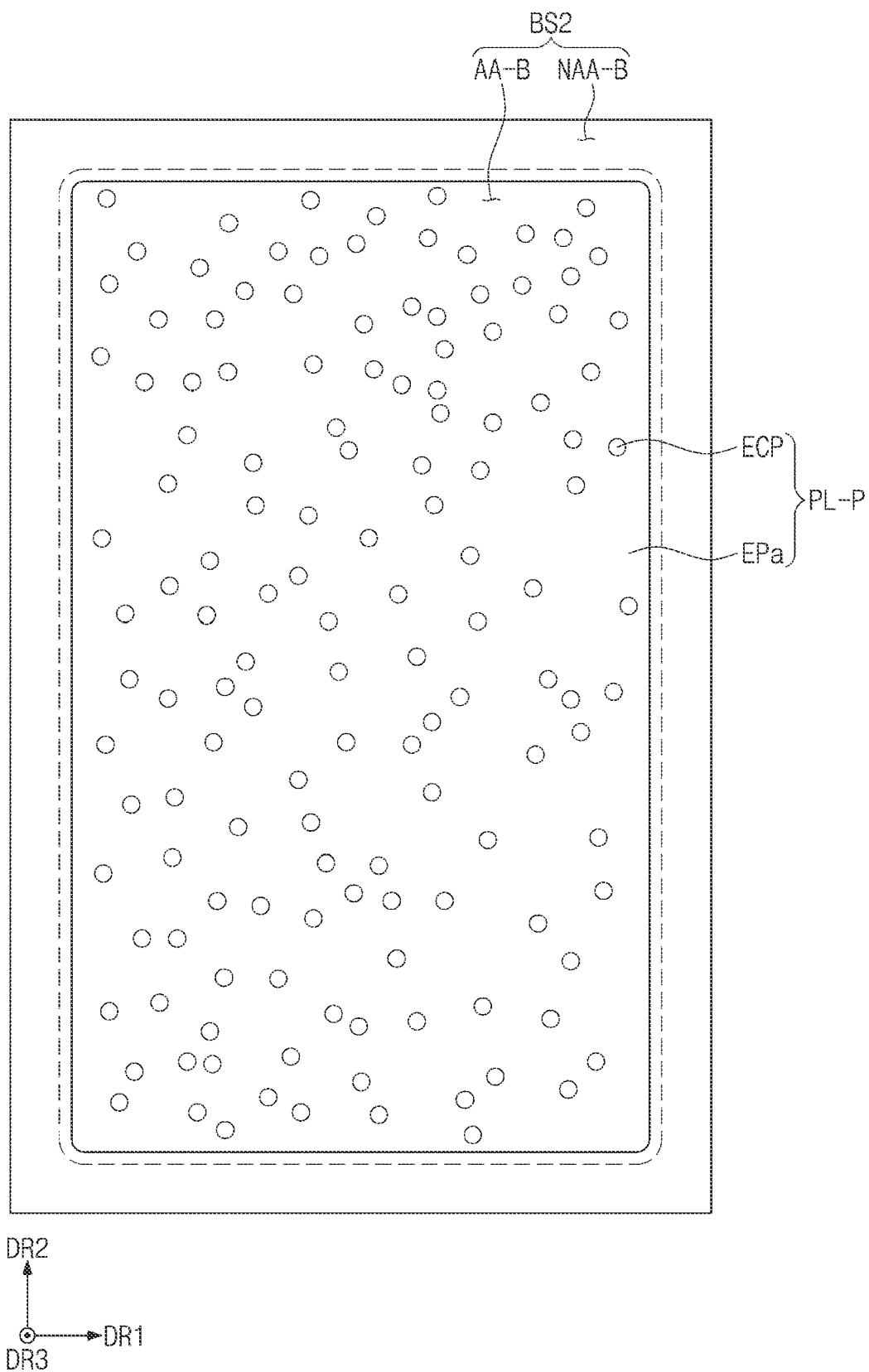

Referring to FIG. 10C, the base layer BS2 may include an active area AA-B and a peripheral area NAA-B. The peripheral area NAA-B may surround the active area AA-B. The active area AA-B corresponds to the active area AA (see FIG. 1B), and the peripheral area NAA-B corresponds to the peripheral area NAA (see FIG. 1B).

The middle layer PL-P may be formed only in an area overlapping the active area AA-B on a plane. For example, the middle layer PL-P may not be formed in the area overlapping the peripheral area NAA-B.

Figure 10D:
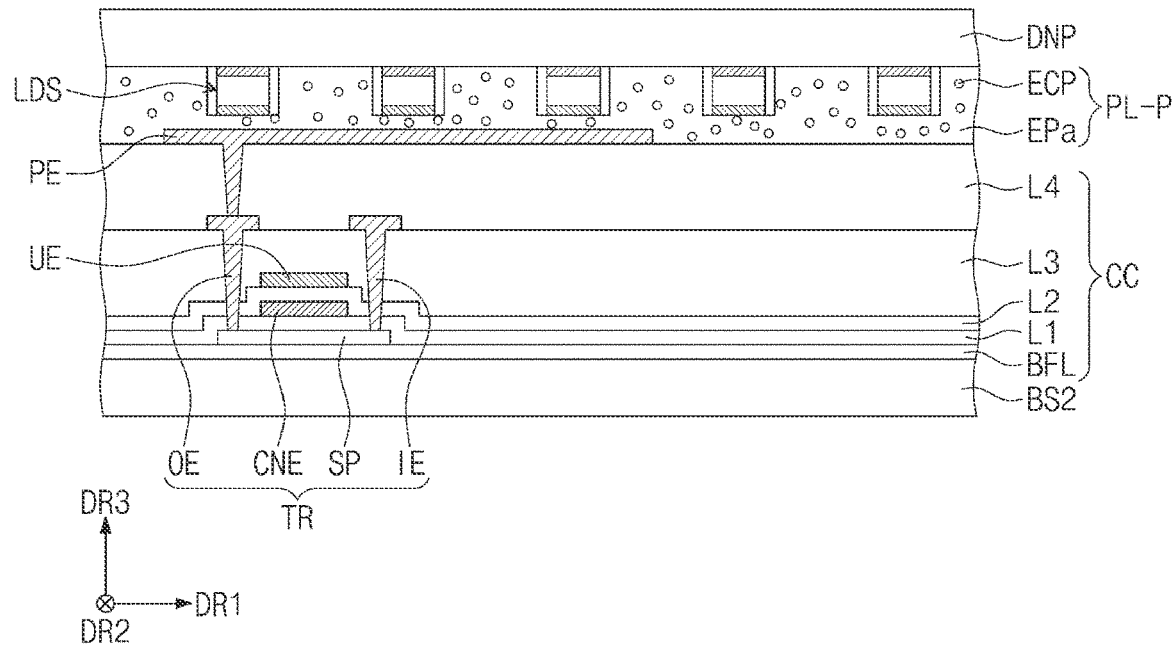

Referring to FIG. 10D, a donor substrate DNP to which a plurality of light emitting diodes LDS are attached is prepared. Thereafter, a plurality of light emitting diodes LDS are contacted on the middle layer PL-P.

Figure 10E:
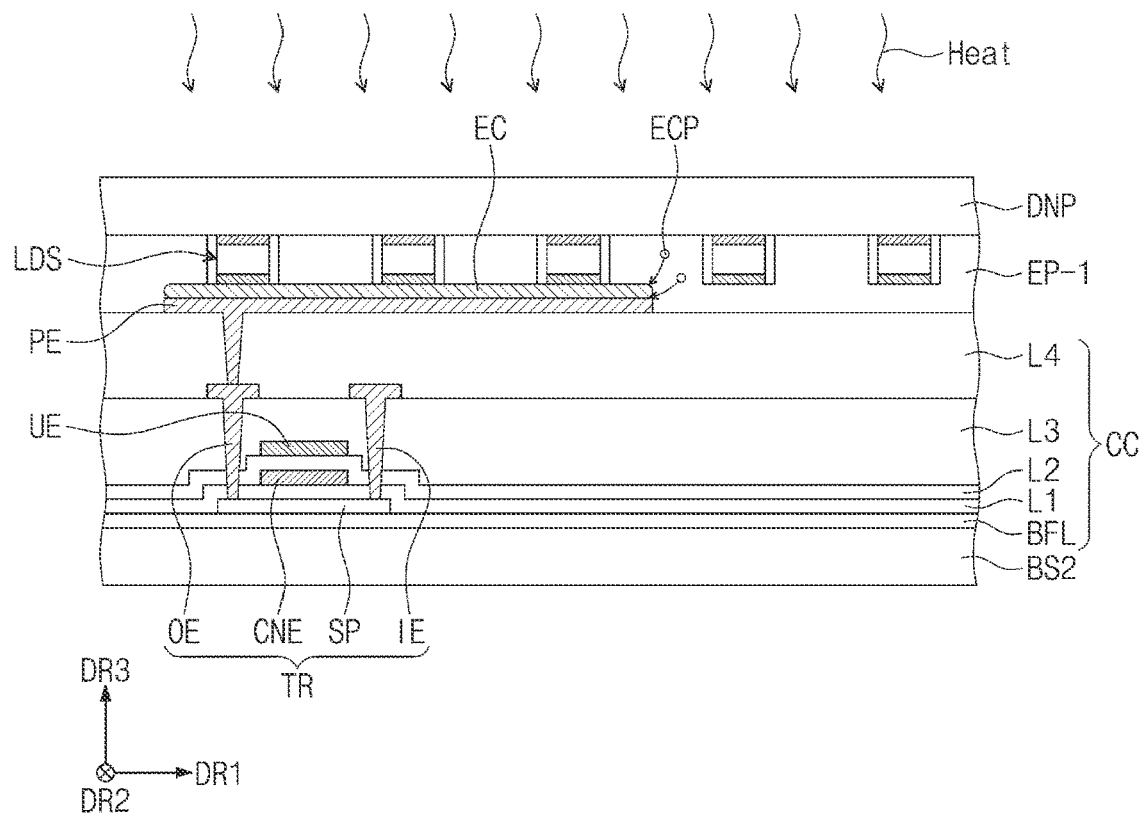

Referring to FIG. 10E, the middle layer PL-P is heated. The conductive particles ECP of the heated middle layer PL-P may be condensed on the pixel electrode PE to form the conductive layer EC, and the polymer resin EPa in which the concentration of the conductive particles ECP is reduced may form the polymer resin layer EP-1. The heating temperature may be between 140 degrees and 180 degrees. As the heating temperature is higher, the heating time may be shortened. For example, if the heating temperature is 140 degrees, the middle layer PL-P may be heated for 3 minutes, and if the heating temperature is 180 degrees, the middle layer PL-P may be heated for 30 seconds. However, the heating temperature and the heating time are merely numerical values, and the inventive concept is not limited thereto. The heating temperature and heating time may vary depending on the nature of the conductive particles ECP.

When the middle layer PL-P is heated, the conductive particles ECP may be melted. The conductive particles ECP may include a tin-bismuth alloy. The melting point of the tin-bismuth alloy may be about 139 degrees. In an embodiment of the inventive concept, the molten conductive particles ECP may be condensed onto the pixel electrode PE.

According to an embodiment of the inventive concept, when the middle layer PL-P is heated after the donor substrate DNP on which the light emitting diodes LDS are disposed contacts the middle layer PL-P, the conductive particles ECP are condensed and melted between the pixel electrode PE and the light emitting diodes LDS so that the conductive layer EC may be formed. That is, the alignment process for transferring a portion of the light emitting diodes LDS onto the pixel electrode PE may be omitted. Therefore, the process for manufacturing the display panel may be simplified, and the process speed may be improved.

In another embodiment of the inventive concept, unlike the embodiment shown in FIG. 10E, the conductive layer EC may surround a portion of each of the light emitting diodes LDS in the thickness direction, for example, the third direction DR3.

Figure 10F:
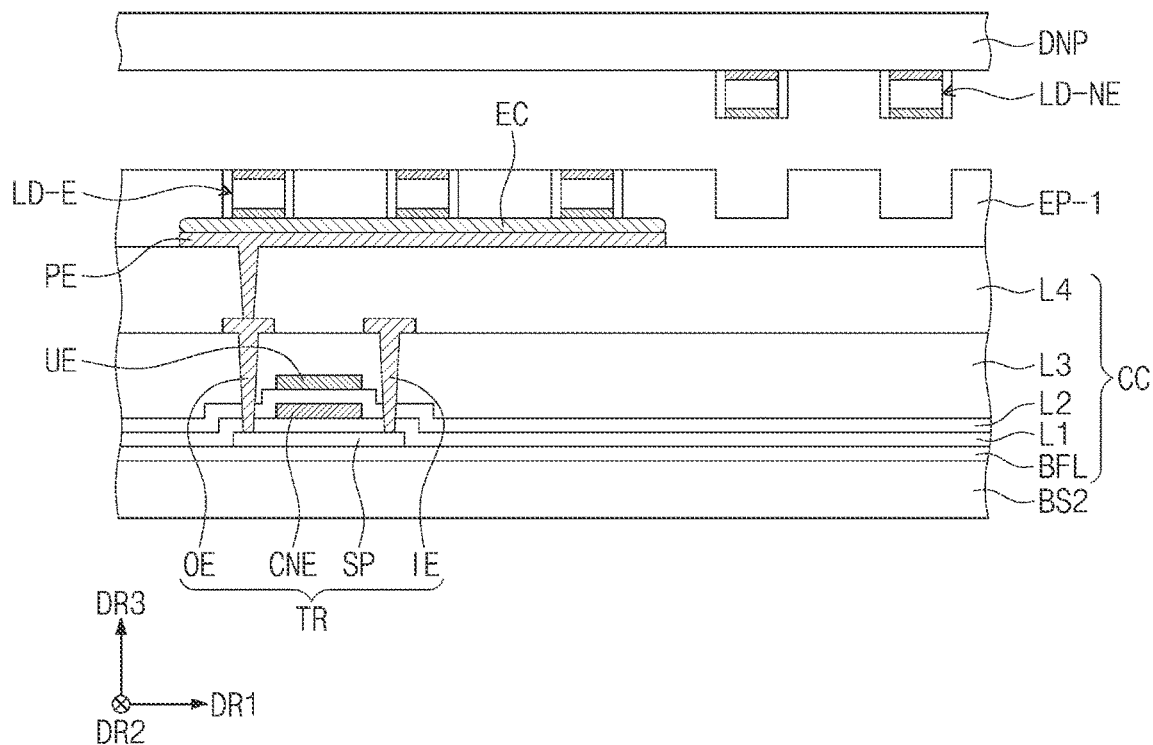

Referring to FIG. 10F, after hardening the polymer resin layer EP-1, the donor substrate DNP is separated. The valid light emitting diodes LD-E disposed on the pixel electrodes PE among the plurality of light emitting diodes LDS (see FIG. 10E) may be transferred onto the pixel electrodes PE. The remaining light emitting diodes LD-NE (hereinafter referred to as invalid light emitting diodes) may be separated from the polymer resin layer EP-1 together with the donor substrate DNP.

The polymer resin layer EP-1 and the conductive layer EC may be distinguished by the difference in the concentration of the conductive particles ECP. For example, the concentration of the conductive particles ECP included in the conductive layer EC may be higher than the concentration of the conductive particles ECP included in the polymer resin layer EP-1. The conductive particles ECP may not be included in the polymer resin layer EP-1, but some non-condensed conductive particles ECP may be dispersed.

Figure 10G:
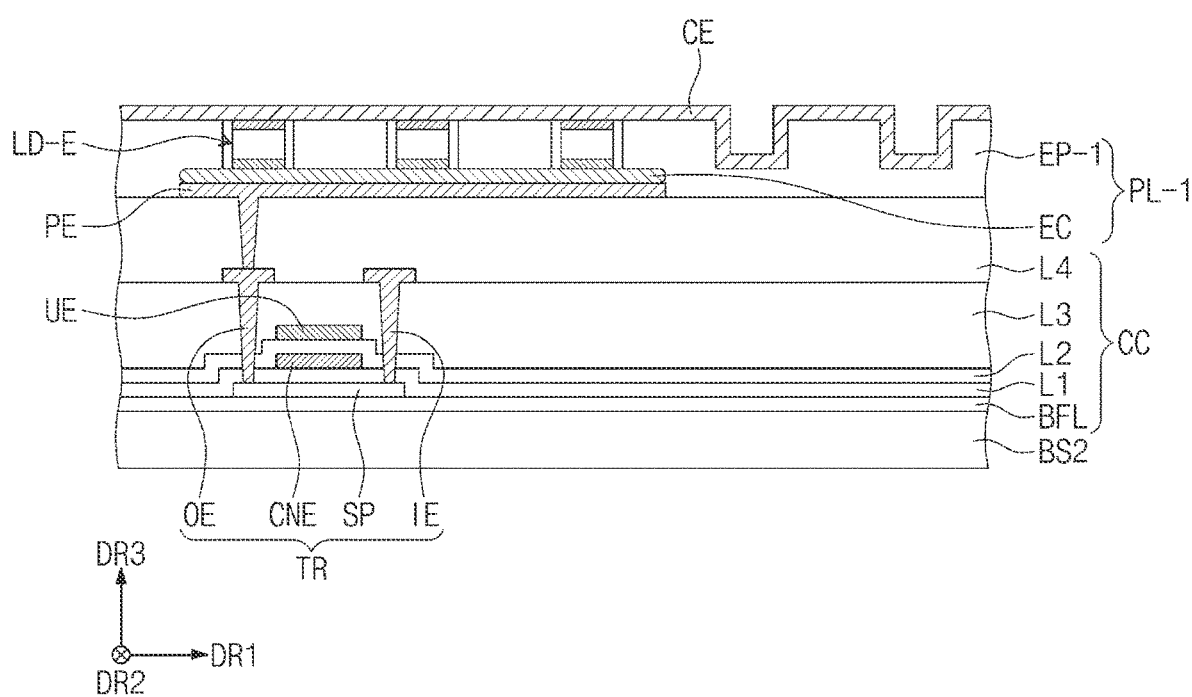

Referring to FIG. 10G, a common electrode CE is formed on the middle layer PL-1. The valid light emitting diodes LD-E may be electrically connected to the common electrode CE and the pixel electrode PE to provide light.

Figure 11:
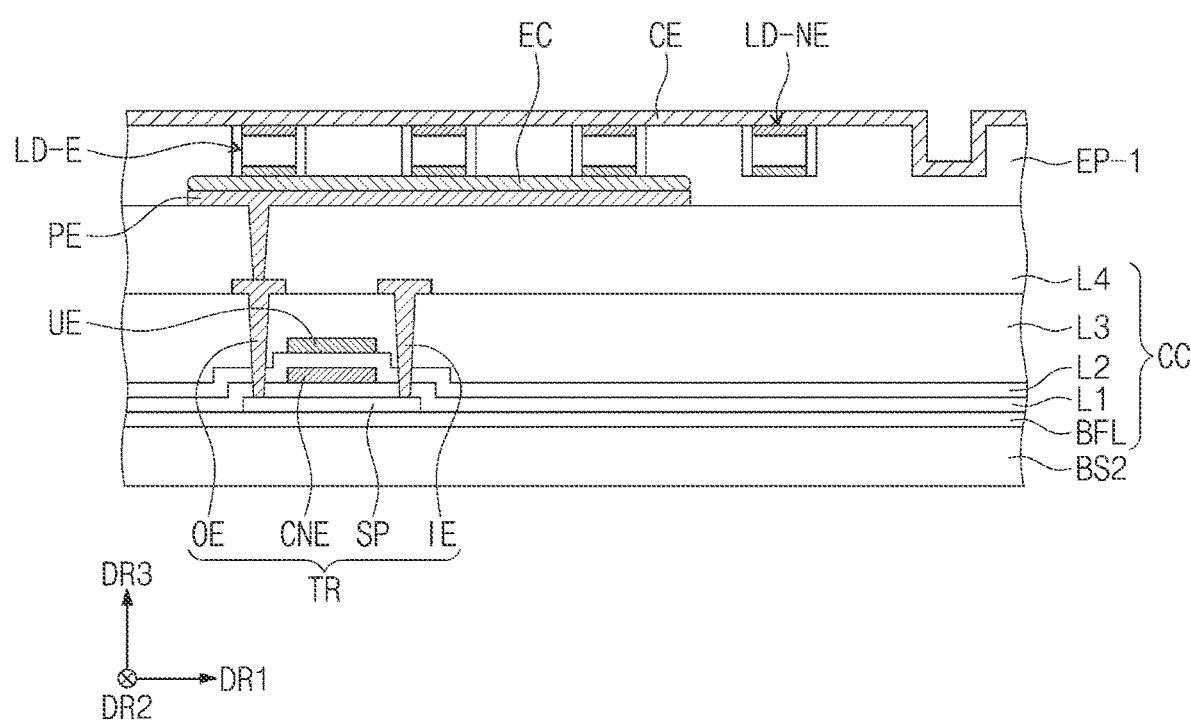
FIG. 11 is a cross-sectional view of a portion of the structure of a display panel according to an embodiment of the inventive concept.

FIG. 11 is a cross-sectional view of a portion of the structure of a display panel according to an embodiment of the inventive concept.

Referring to FIG. 11, at least some of the invalid light emitting diodes LD-NE may not be separated from the polymer resin layer EP-1. The invalid light emitting diode LD-NE is not electrically connected to the pixel electrode PE. Therefore, the invalid light emitting diode LD-NE may not provide light.

FIGS. 12A to 12D are views showing a portion of a manufacturing process of a display panel according to an embodiment of the inventive concept.

Figure 12A:
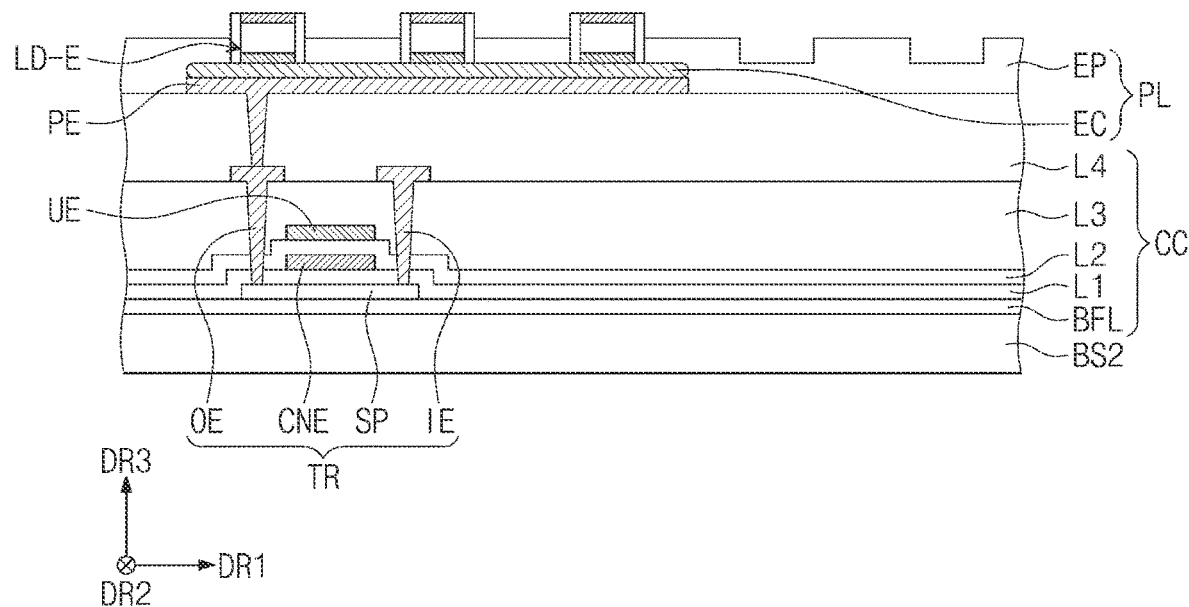
FIGS. 12A, 12B, 12C, and 12D are views showing a portion of a manufacturing process of a display panel according to an embodiment of the inventive concept.

Referring to FIG. 12A, the thickness of the polymer resin layer EP may be thinner than the thickness of the polymer resin layer EP-1 of FIG. 10F.

Figure 12B:
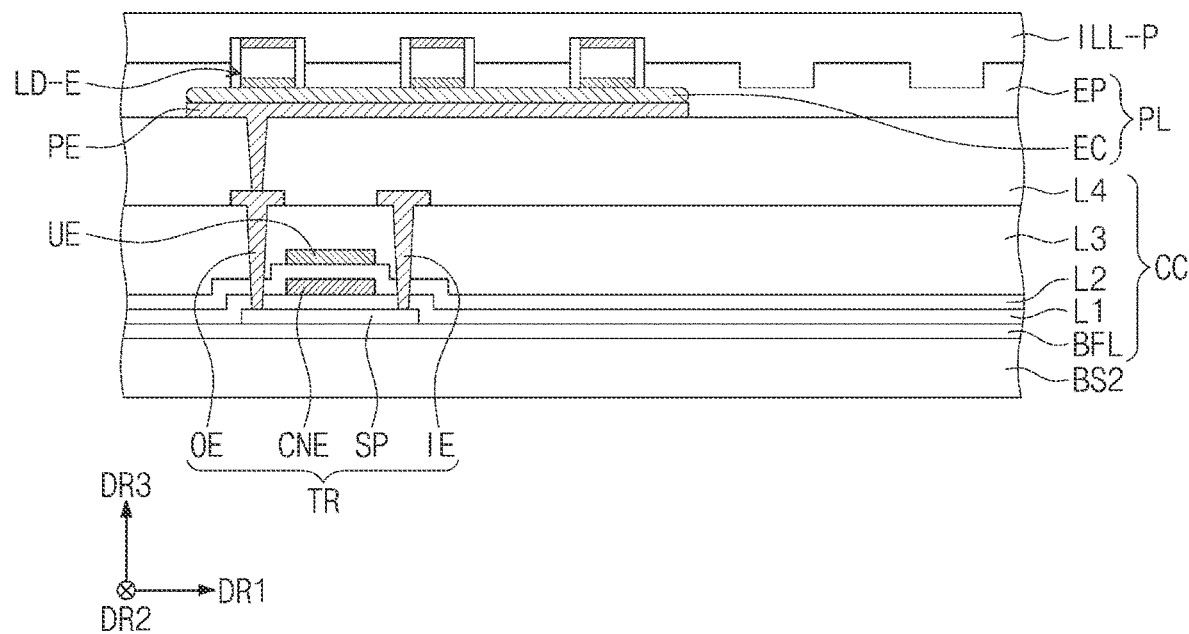

Referring to FIG. 12B, a preliminary insulating layer ILL-P is formed on the middle layer PL. The preliminary insulating layer ILL-P may be a photoresist layer.

Figure 12C:
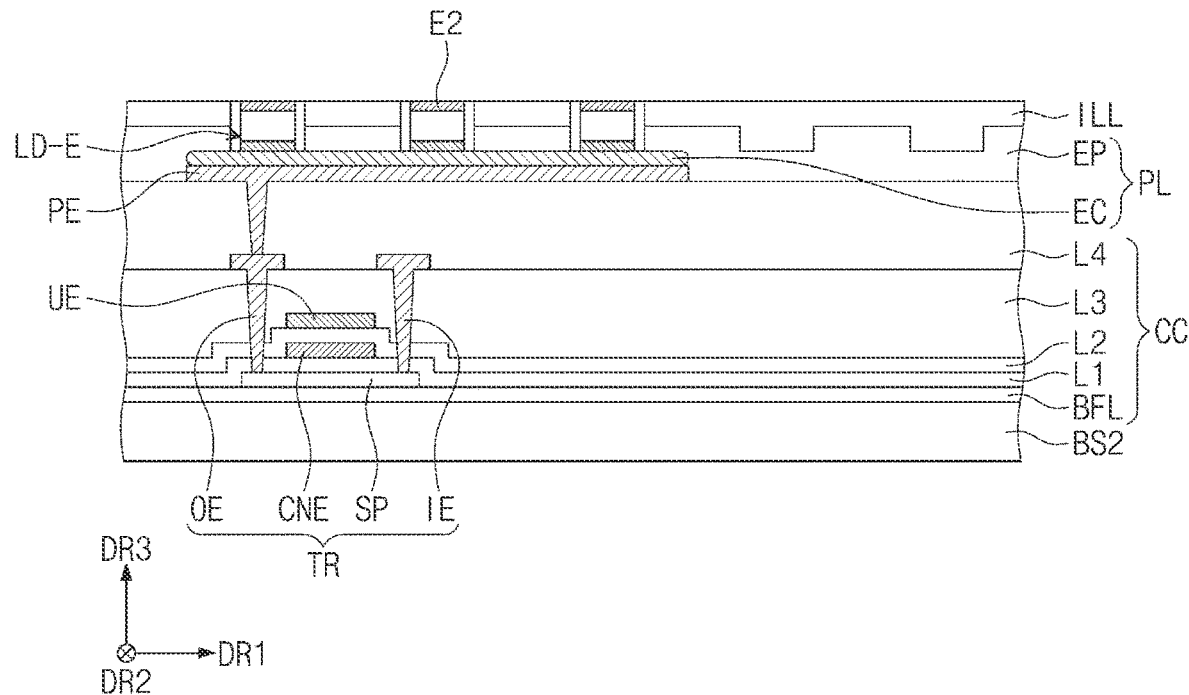

Referring to FIG. 12C, a portion of the preliminary insulating layer ILL-P in the thickness direction is etched to form an insulating layer ILL. The insulating layer ILL exposes the second electrode E2 (see FIG. 5B) of the valid light emitting diode LD-E and may cover the middle layer PL.

Figure 12D:
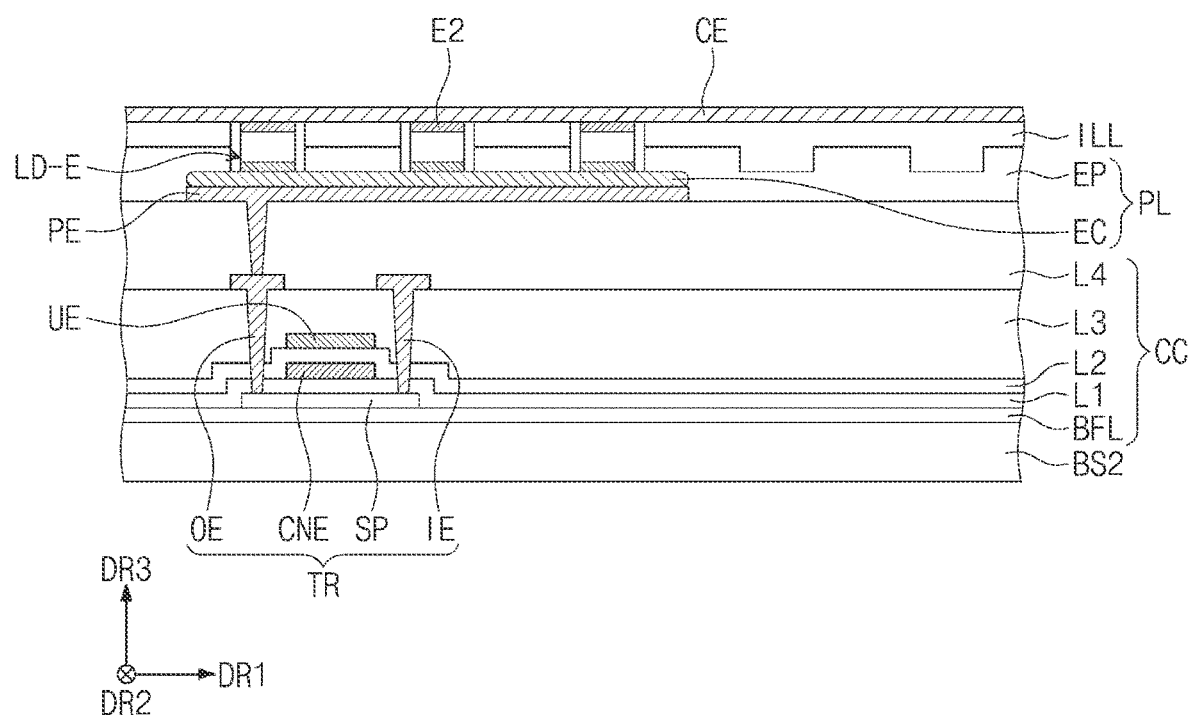

Referring to FIG. 12D, a common electrode CE is formed on the insulating layer ILL.

Figure 13:
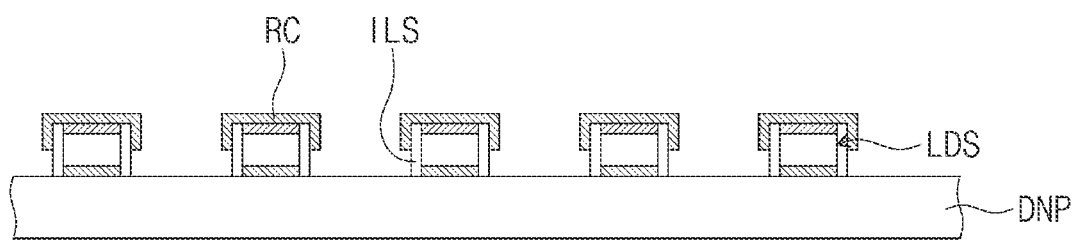
FIG. 13 is a view showing a portion of a manufacturing process of a display panel according to an embodiment of the inventive concept.

FIG. 13 is a view showing a portion of a manufacturing process of a display panel according to an embodiment of the inventive concept.

Referring to FIG. 13, an operation of forming reflection layers RC on a plurality of light emitting diodes LDS formed on one side of the donor substrate DNP is shown. The reflection layers RC may be formed after forming the cover layers ILS covering the sidewall of the light emitting diodes LDS, respectively.

Figure 14:
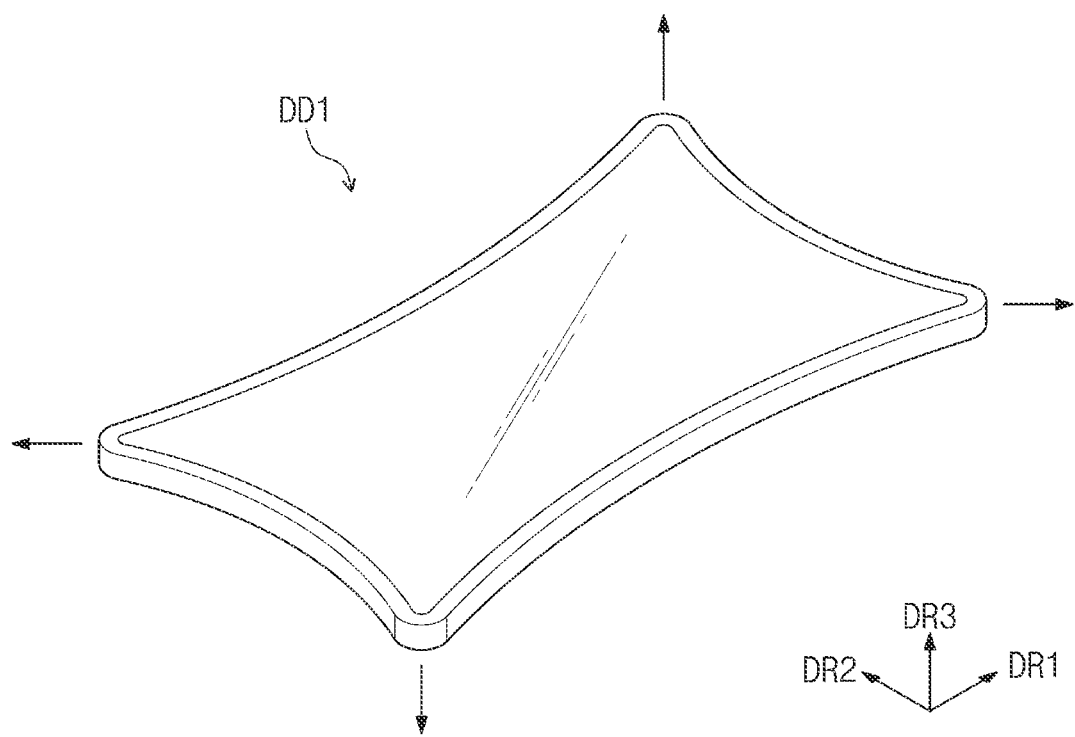
FIG. 14 is a perspective view of a display device according to an embodiment of the inventive concept.
Figure 15:
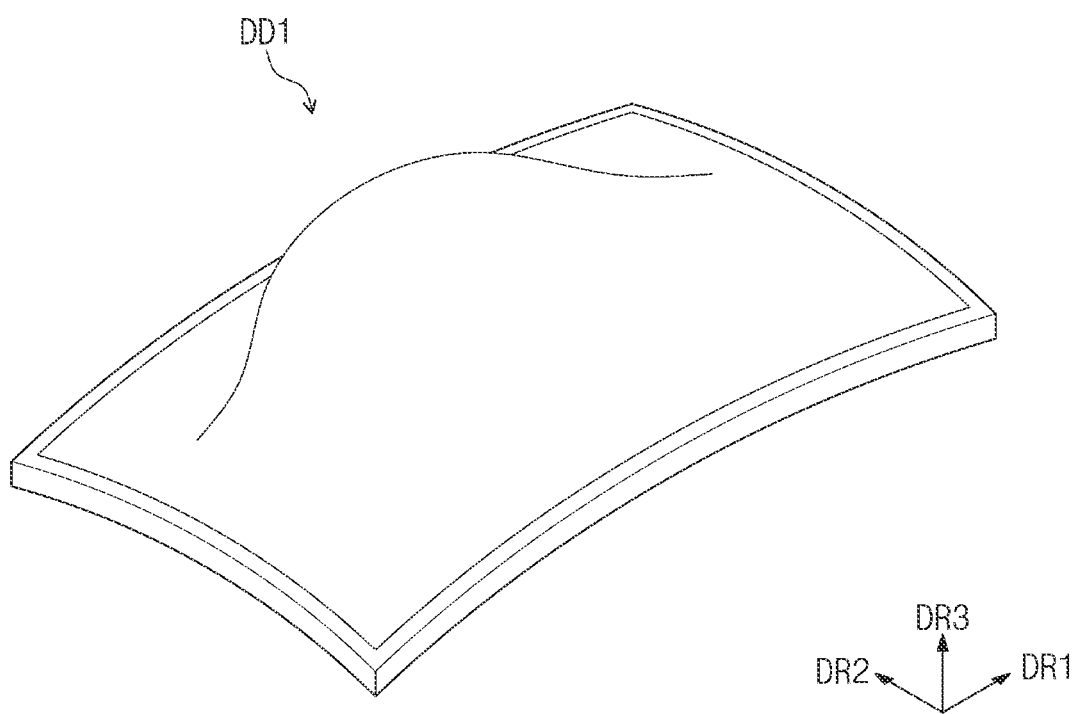
FIG. 15 is a perspective view of a display device according to an embodiment of the inventive concept.

FIG. 14 is a perspective view of a display device according to an embodiment of the inventive concept. FIG. 15 is a perspective view of a display device according to an embodiment of the inventive concept.

Referring to FIGS. 14 and 15, the display device DD1 may be a stretchable display device. In this case, the shape of the display device DD1 may be variously modified. For example, the display device DD1 may extend in various directions.

As shown in FIG. 14, the display device DD1 may extend in various directions on a plane defined by the first direction DR1 and the second direction DR2. The shape modification of the display device DD1 may be made by an externally applied force.

As shown in FIG. 15, the display device DD1 may extend in a direction protruding from the display surface FS.

Since the shape of the display device DD1 may be easily modified, the display device DD1 may be mounted on a mounting surface having various shapes. For example, the display device DD1 may be mounted on a curved mounting surface inside the automobile.

The contents described above with reference to FIGS. 2 to 13 may also be applied to the display device DD1 shown in FIGS. 14 and 15.

According to an embodiment of the inventive concept, when the middle layer is heated after contacting the donor substrate on which the light emitting diodes are arranged, conductive particles may be condensed and melted between the pixel electrode and the light emitting diodes to form a conductive layer. That is, the alignment process for transferring the light emitting diodes onto the pixel electrode may be omitted. Therefore, the process for manufacturing the display panel may be simplified, and the process speed may be improved. In addition, a plurality of light emitting diodes may be disposed on one pixel electrode. Therefore, even if one of the plurality of light emitting diodes does not emit light, another light emitting diode may emit light. As a result, the probability of occurrence of defective pixels that do not provide light may be reduced.

Although the exemplary embodiments of the inventive concept have been described, it is understood that the inventive concept should not be limited to these exemplary embodiments but various changes and modifications may be made by one ordinary skilled in the art within the spirit and scope of the inventive concept as claimed.

What is claimed is:

1. A display device manufacturing method comprising:
forming a base layer;
forming a pixel circuit on the base layer;
forming a pixel electrode electrically connected to the pixel circuit on the pixel circuit;
forming a middle layer in which a polymer resin and conductive particles are mixed on the pixel electrode;
contacting a plurality of light emitting diodes attached to a donor substrate on the middle layer;
heating the middle layer to condense the conductive particles on the pixel electrode;
separating the donor substrate from the middle layer; and
forming a common electrode on valid light emitting diodes transferred onto the pixel electrode among the plurality of light emitting diodes.

2. The method of claim 1, further comprising:
forming an insulating layer on the valid light emitting diodes; and
removing a portion of the insulating layer to expose at least a portion of the valid light emitting diodes,
wherein the common electrode is formed on the insulating layer.

3. The method of claim 1, wherein the heating of the middle layer comprises heating the middle layer at a temperature between 140 degrees and 180 degrees.

4. The method of claim 1, wherein the pixel electrode is formed of copper, silver, gold, or an alloy thereof.

5. The method of claim 1, further comprising forming a reflection layer on each of the plurality of light emitting diodes formed on the donor substrate.

6. The method of claim 1, wherein the forming of the middle layer comprises screen-printing a material in which the polymer resin and the conductive particles are mixed.

7. The method of claim 1, wherein the forming of the middle layer comprises slit-coating a material in which the polymer resin and the conductive particles are mixed.

8. The method of claim 1, wherein the base layer comprises an active area and a peripheral area surrounding the active area,
wherein the middle layer is formed only in an area overlapping the active area on a plane.

9. The method of claim 1, wherein the heating of the middle layer is performed after the plurality of light emitting diodes are in contact with the middle layer.

* * * * *